(12) United States Patent
Ushikubo

(10) Patent No.: US 12,707,808 B2
(45) Date of Patent: Aug. 11, 2026

(54) DISPLAY DEVICE AND MANUFACTURING METHOD OF DISPLAY DEVICE

(71) Applicant: Magnolia White Corporation, Tokyo (JP)

(72) Inventor: Takahiro Ushikubo, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 446 days.

(21) Appl. No.: 18/454,090

(22) Filed: Aug. 23, 2023

(65) Prior Publication Data

US 2024/0074231 A1 Feb. 29, 2024

(30) Foreign Application Priority Data

Aug. 26, 2022 (JP) ................................ 2022-134876

(51) Int. Cl.
*H10K 59/12* (2023.01)
*H10K 59/80* (2023.01)
*H10K 102/00* (2023.01)

(52) U.S. Cl.
CPC ..... *H10K 59/1201* (2023.02); *H10K 59/8051* (2023.02); *H10K 59/8722* (2023.02); *H10K 2102/302* (2023.02)

(58) Field of Classification Search
CPC ........... H10K 59/1201; H10K 59/8722; H10K 59/8051; H10K 2102/302
See application file for complete search history.

(56) References Cited

U.S. PATENT DOCUMENTS

| | | | | |
|---|---|---|---|---|
| 2004/0160170 | A1 | 8/2004 | Sato et al. | |
| 2009/0009069 | A1 | 1/2009 | Takata | |
| 2019/0363275 | A1 | 11/2019 | Ochi et al. | |
| 2022/0077251 | A1 | 3/2022 | Choung et al. | |
| 2023/0240118 | A1* | 7/2023 | Fukuda | H10K 71/231 |

FOREIGN PATENT DOCUMENTS

| | | | |
|---|---|---|---|
| JP | 2000-195677 | A | 7/2000 |
| JP | 2004-207217 | A | 7/2004 |
| JP | 2008-135325 | A | 6/2008 |
| JP | 2009-032673 | A | 2/2009 |
| JP | 2010-118191 | A | 5/2010 |
| WO | 2018/179308 | A1 | 10/2018 |

* cited by examiner

*Primary Examiner* — Anne M Hines
(74) *Attorney, Agent, or Firm* — XSENSUS LLP

(57) ABSTRACT

According to one embodiment, a display device includes a lower electrode, a rib, a partition including a lower portion which is provided on the rib and is formed of a conductive material, and an upper portion which is provided on the lower portion and protrudes from a side surface of the lower portion, an organic layer provided on the lower electrode, an upper electrode which covers the organic layer and is in contact with the lower portion of the partition, a sealing layer which covers the upper electrode, and a common sealing layer formed of an inorganic insulating material and provided over a broader range than the sealing layer above the sealing layer. The sealing layer is formed of silicon nitride or a transparent oxide.

20 Claims, 18 Drawing Sheets

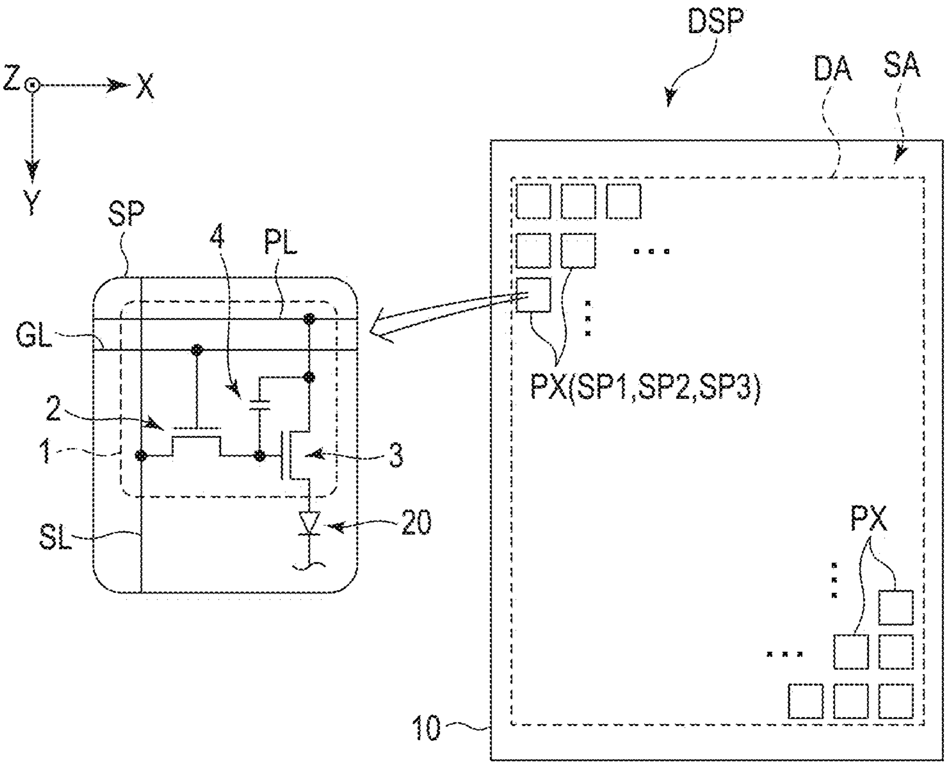
F I G. 1

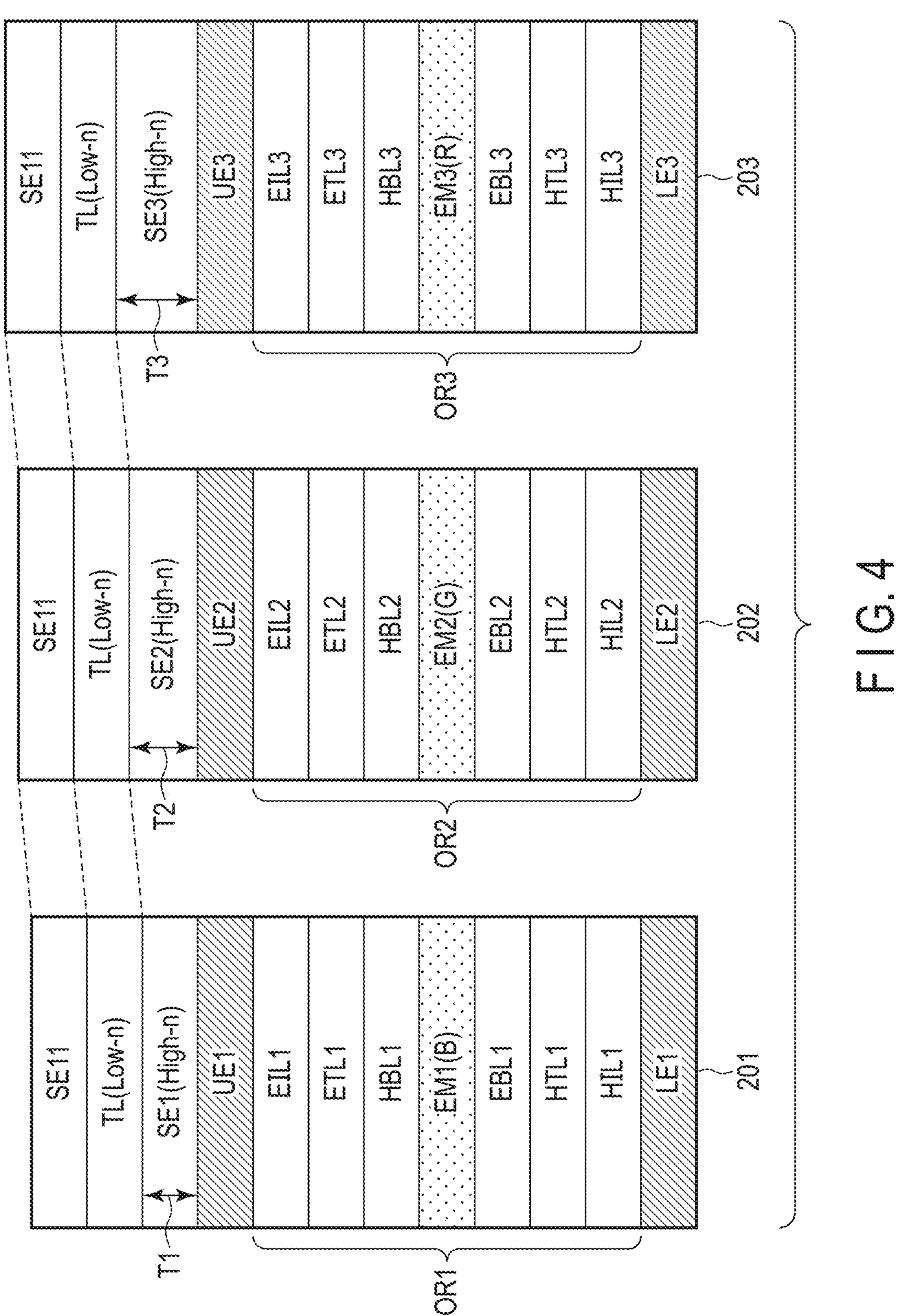
F I G. 4

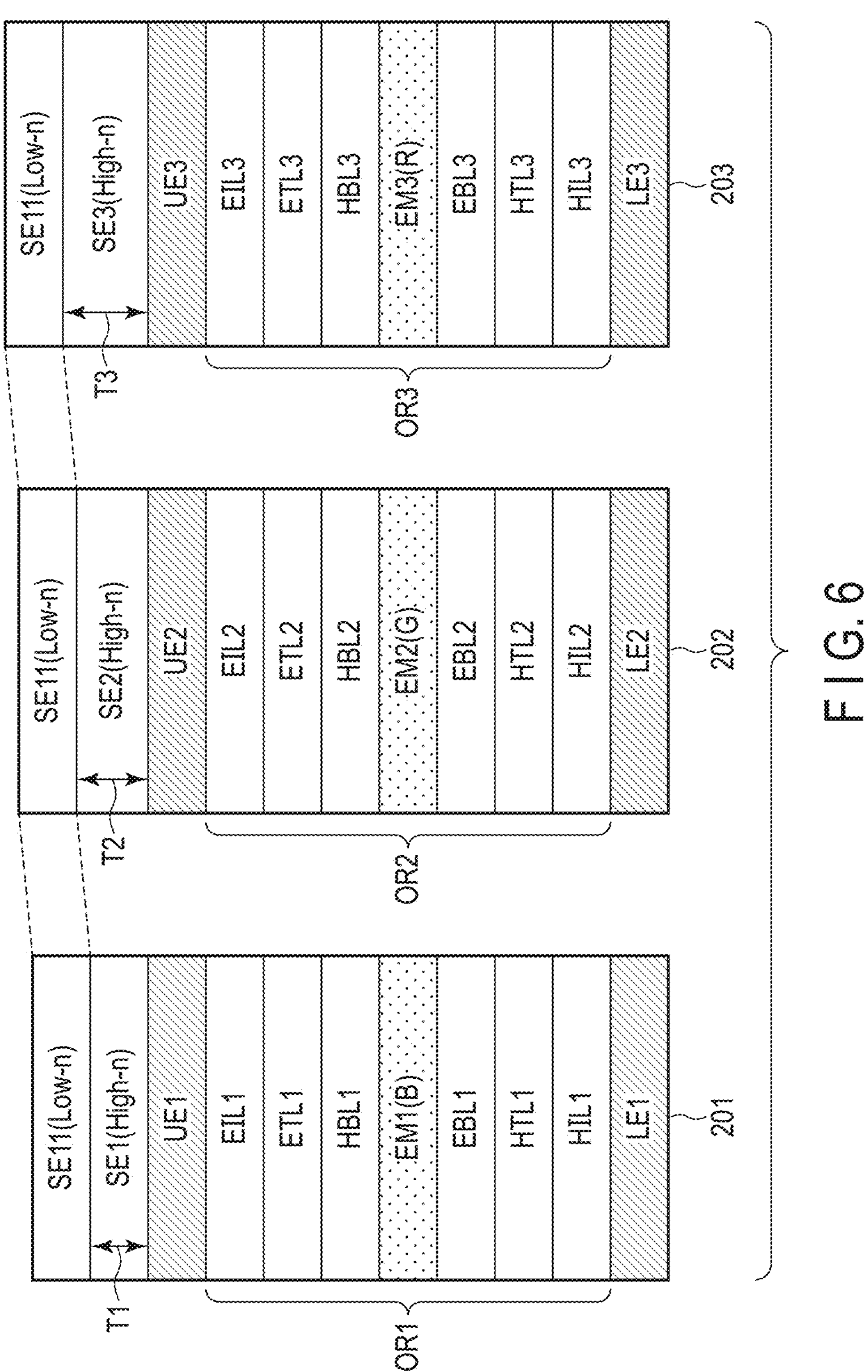
F I G. 6

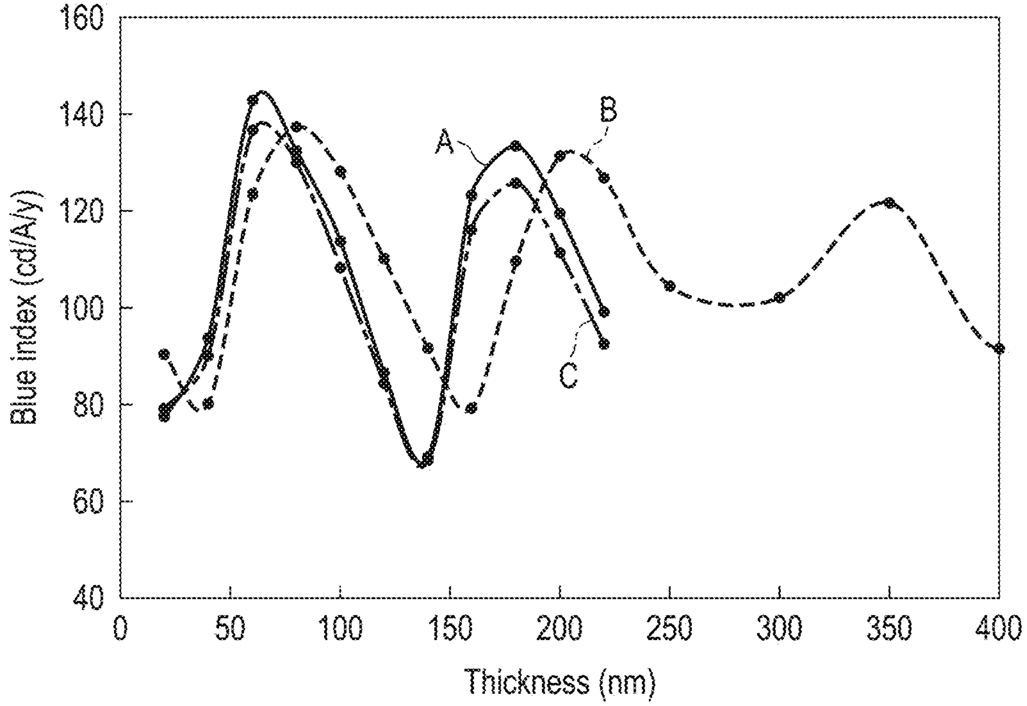
F I G. 7

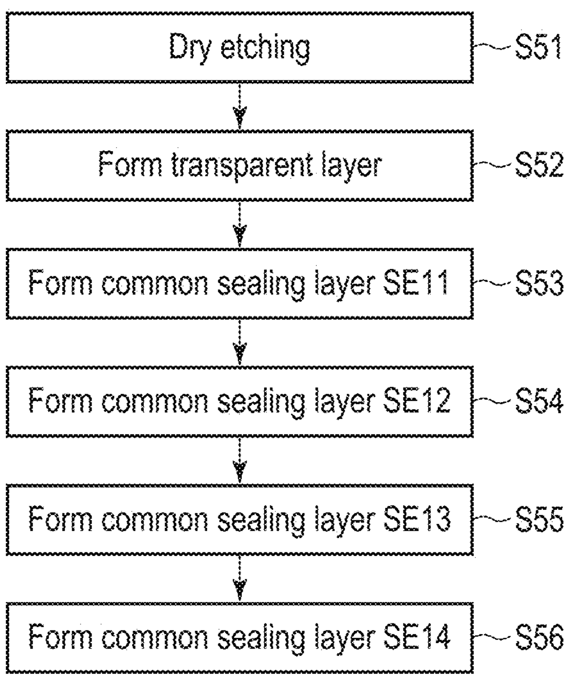
F I G. 9
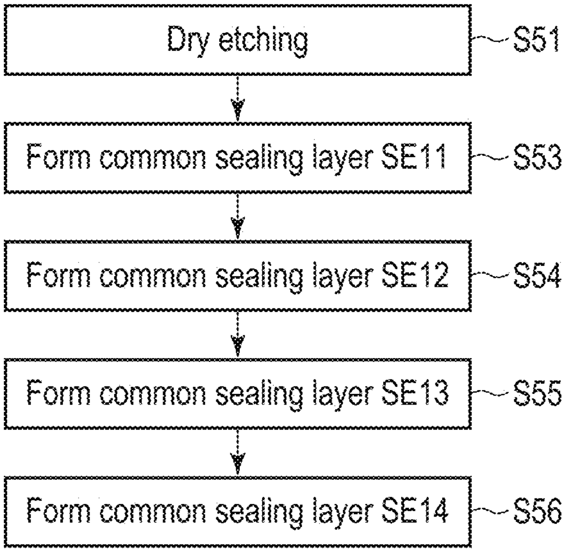
F I G. 10

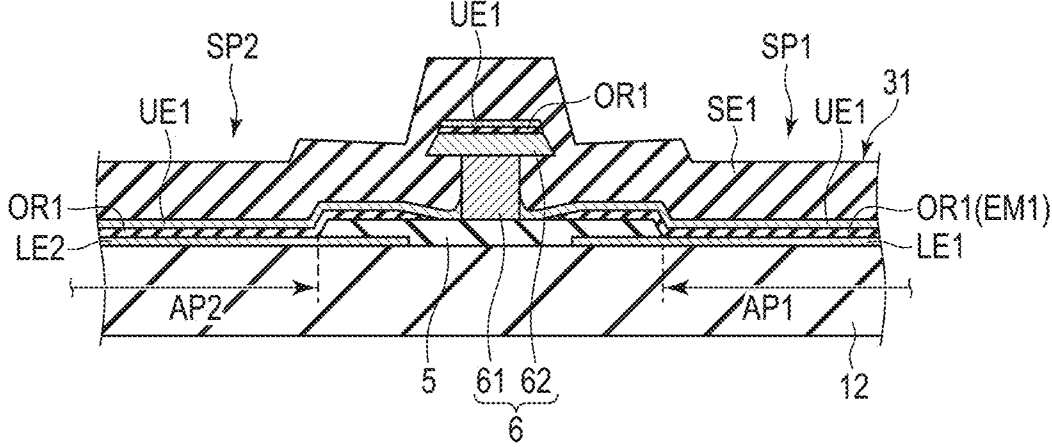
F I G. 11
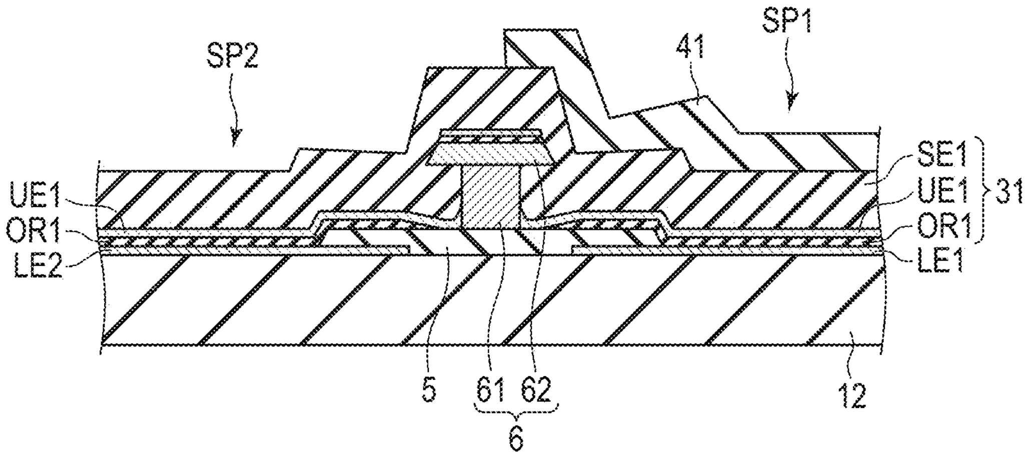
F I G. 12

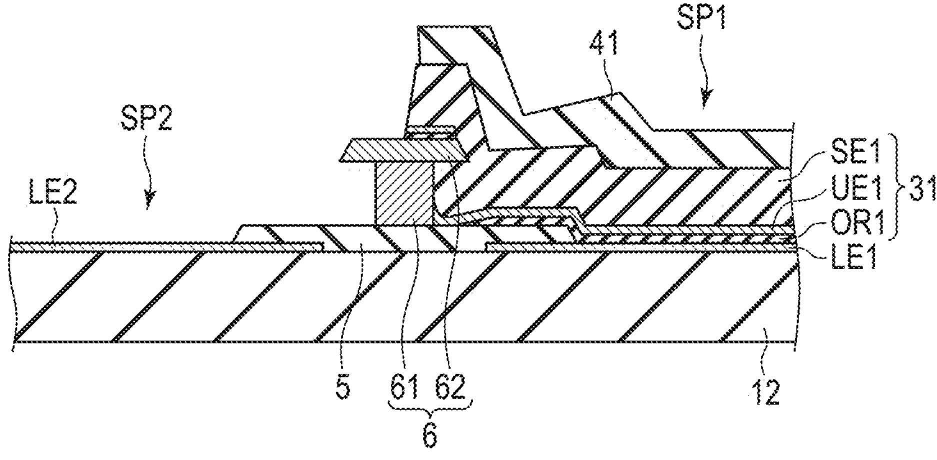
F I G. 13
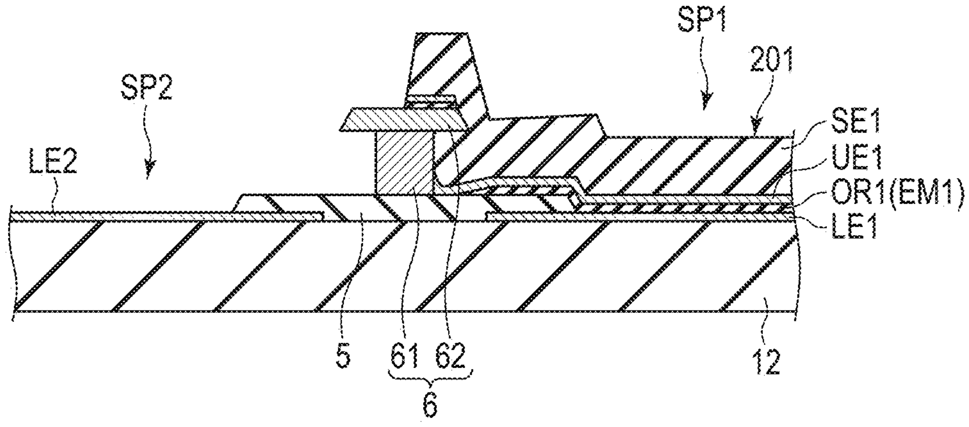
F I G. 14

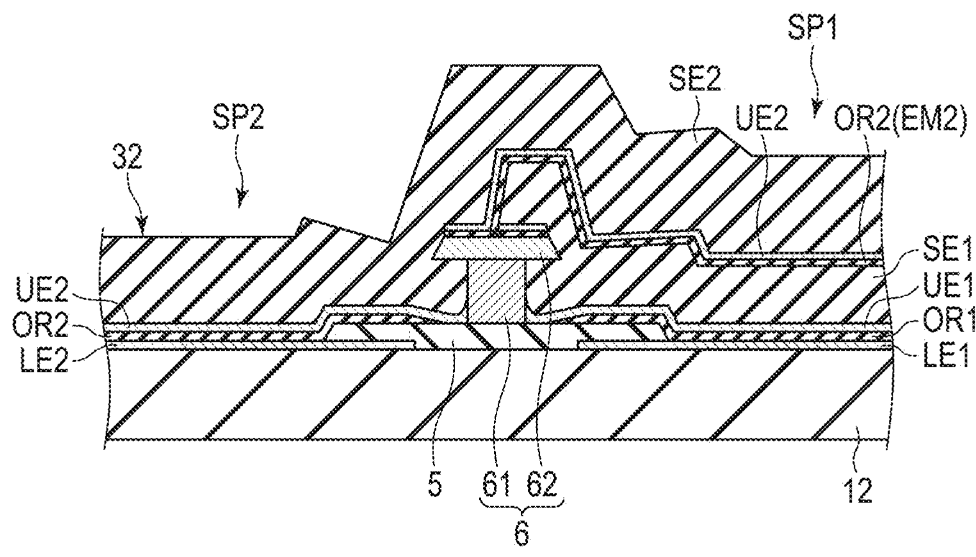
F I G. 15
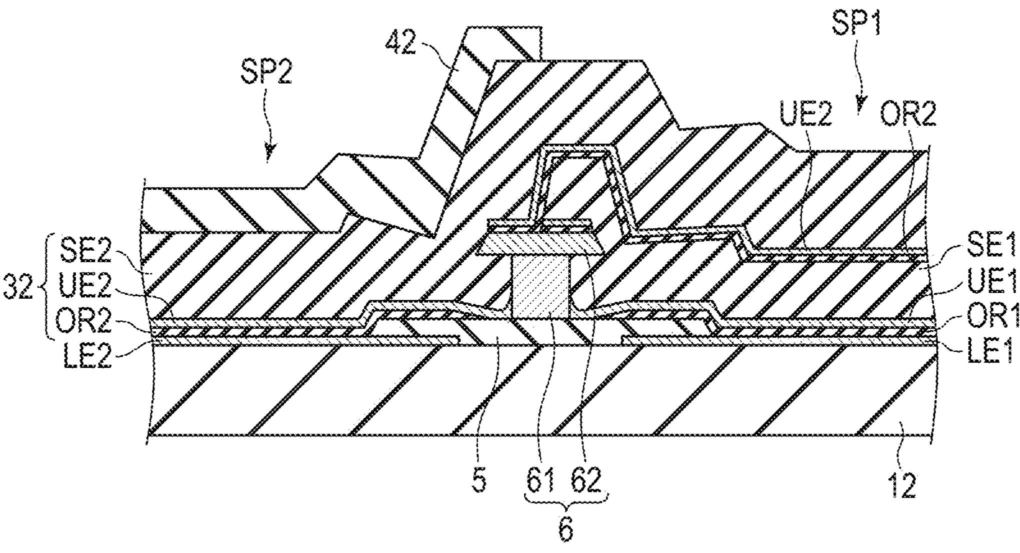
F I G. 16

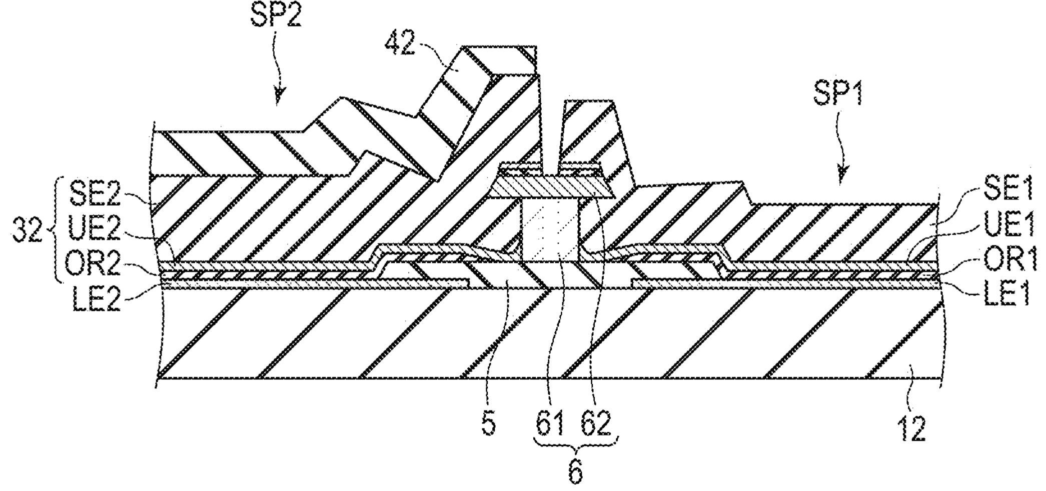
F I G. 17
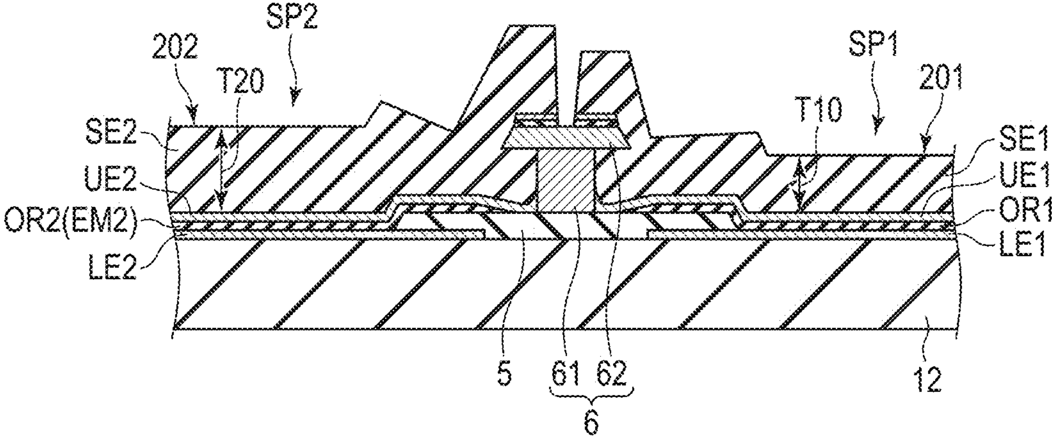
F I G. 18

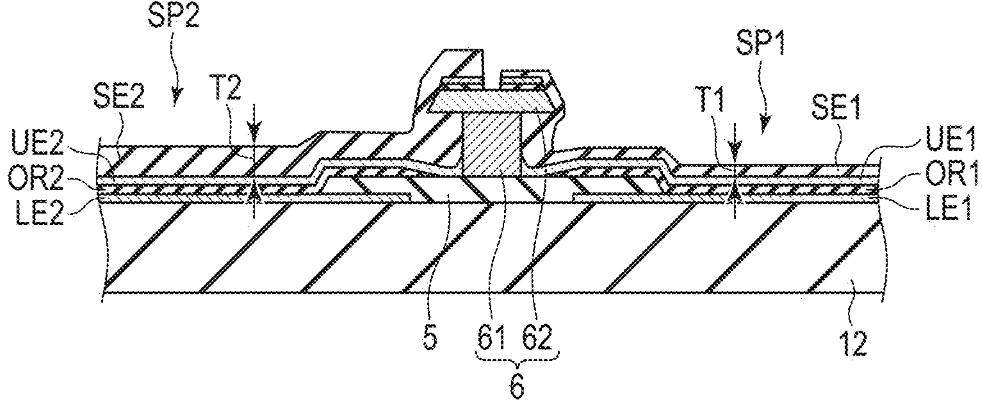
F I G. 19
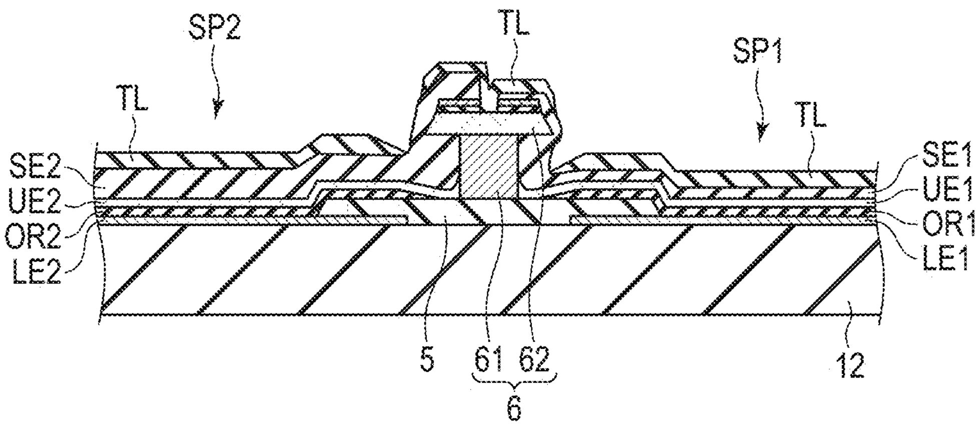
F I G. 20

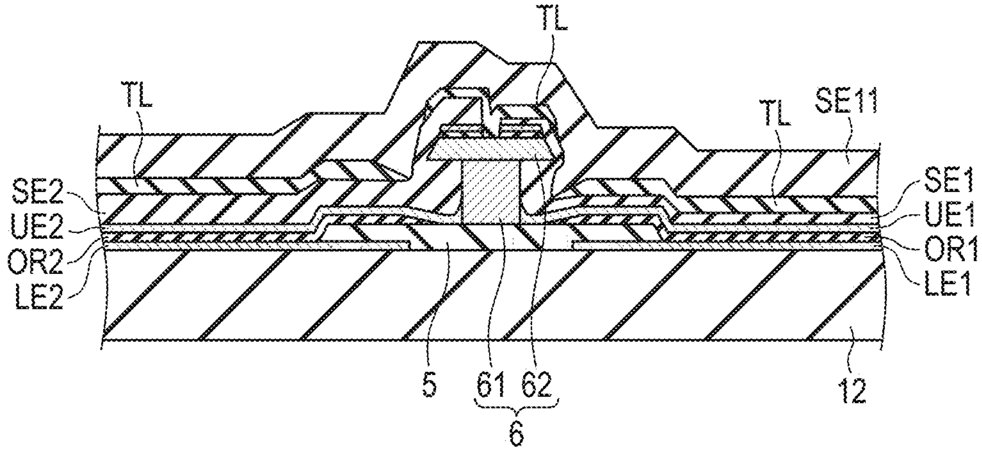
F I G. 21
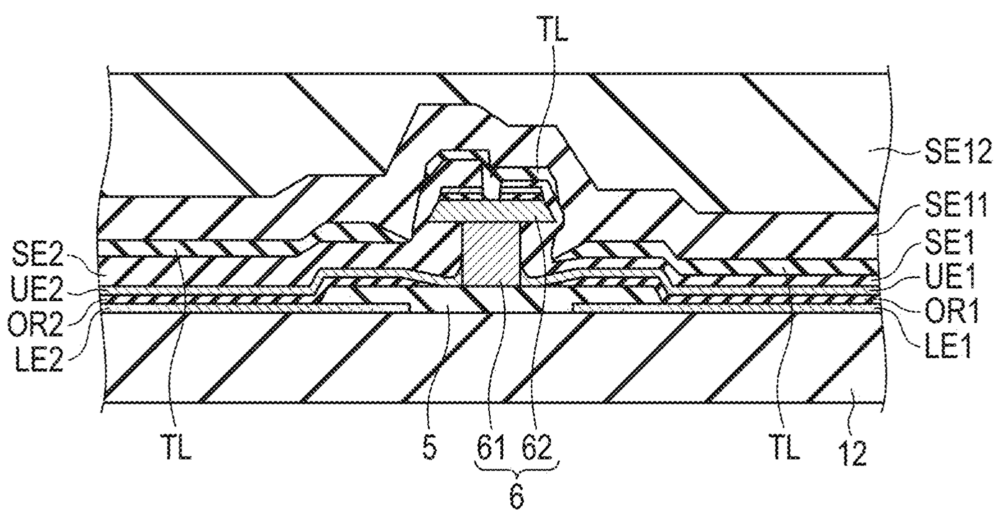
F I G. 22

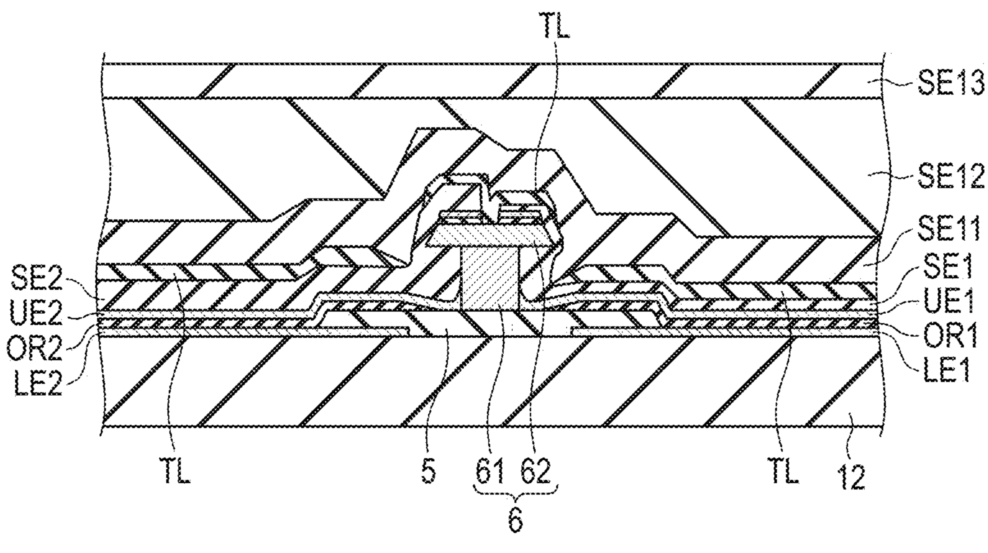
F I G. 23
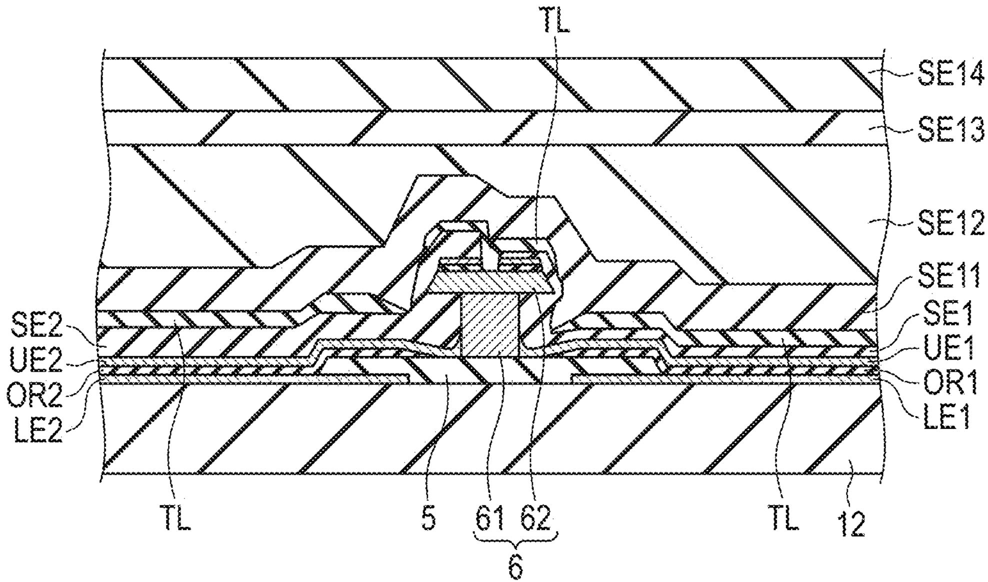
F I G. 24

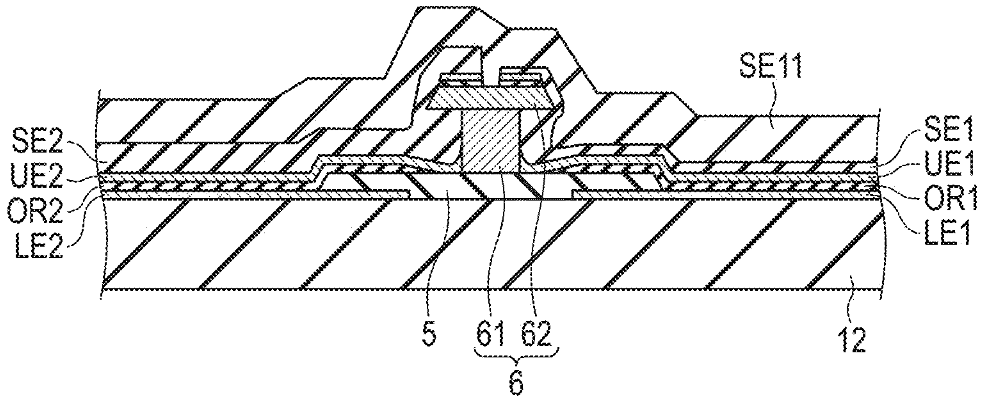
F I G. 25
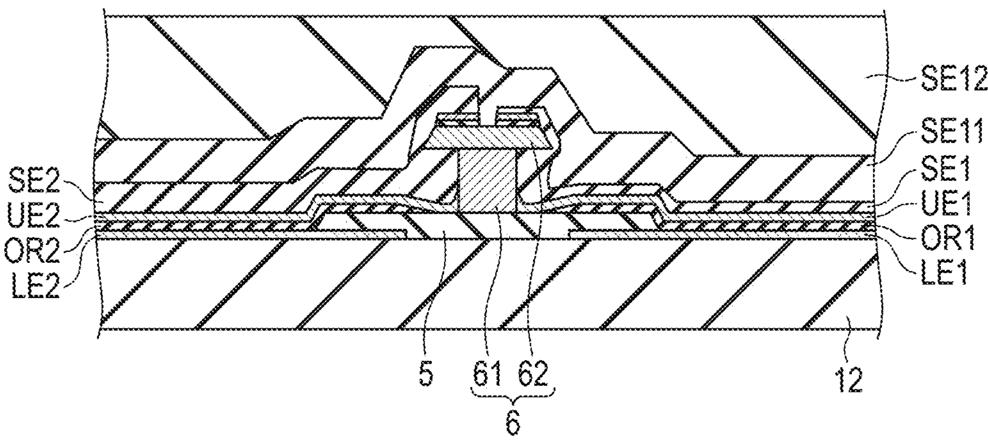
F I G. 26

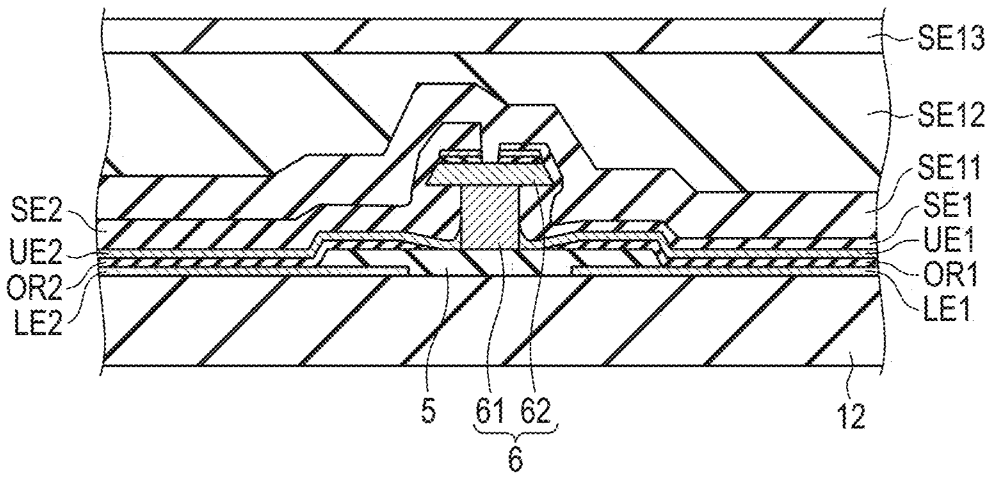
F I G. 27
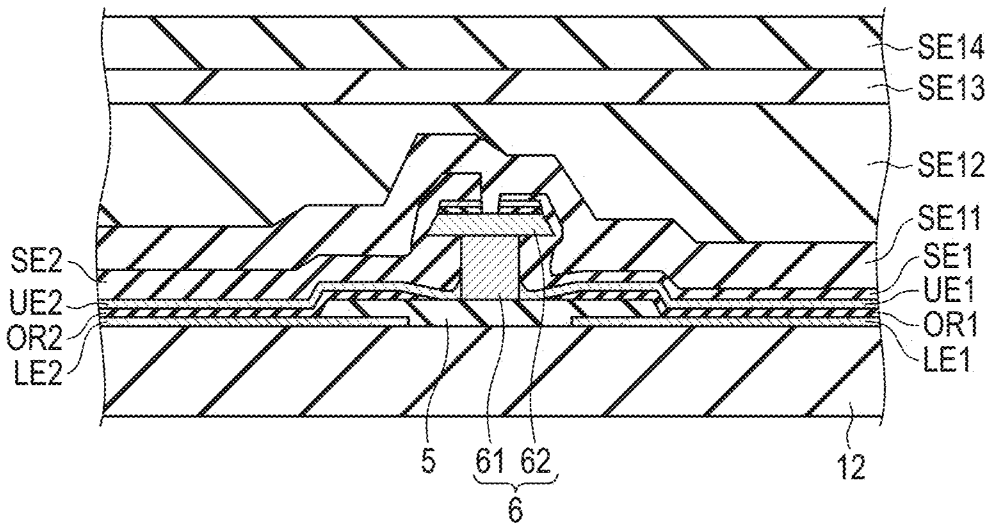
F I G. 28

DISPLAY DEVICE AND MANUFACTURING METHOD OF DISPLAY DEVICE

CROSS-REFERENCE TO RELATED APPLICATIONS

This application is based upon and claims the benefit of priority from Japanese Patent Application No. 2022-134876, filed Aug. 26, 2022, the entire contents of which are incorporated herein by reference.

FIELD

Embodiments described herein relate generally to a display device and a manufacturing method of a display device.

BACKGROUND

Recently, display devices to which an organic light emitting diode (OLED) is applied as a display element have been put into practical use. This display element comprises a pixel circuit including a thin-film transistor, a lower electrode connected to the pixel circuit, an organic layer which covers the lower electrode, and an upper electrode which covers the organic layer. The organic layer includes functional layers such as a hole transport layer and an electron transport layer in addition to a light emitting layer.

In this display element, a technique which improves luminous efficiency and prevents the degradation by moisture is required.

BRIEF DESCRIPTION OF THE DRAWINGS

FIG. 1 is a diagram showing a configuration example of a display device DSP.

FIG. 4 is a diagram showing the display elements 201 to 203 shown in FIG. 3.

FIG. 6 is a diagram showing the display elements 201 to 203 shown in FIG. 5.

FIG. 7 is a diagram showing the simulation results of a BI value relative to the thickness regarding the high-refractive layer of an optical adjustment layer provided in the display element 201.

FIG. 9 is a flow diagram for explaining an example of the manufacturing method of the display device DSP shown in FIG. 3.

FIG. 10 is a flow diagram for explaining an example of the manufacturing method of the display device DSP shown in FIG. 5.

FIG. 11 is a diagram for explaining the manufacturing method of the display device DSP.

FIG. 12 is a diagram for explaining the manufacturing method of the display device DSP.

FIG. 13 is a diagram for explaining the manufacturing method of the display device DSP.

FIG. 14 is a diagram for explaining the manufacturing method of the display device DSP.

FIG. 15 is a diagram for explaining the manufacturing method of the display device DSP.

FIG. 16 is a diagram for explaining the manufacturing method of the display device DSP.

FIG. 17 is a diagram for explaining the manufacturing method of the display device DSP.

FIG. 18 is a diagram for explaining the manufacturing method of the display device DSP.

FIG. 19 is a diagram for explaining the manufacturing method of the display device DSP.

FIG. 20 is a diagram for explaining the manufacturing method of the display device DSP.

FIG. 21 is a diagram for explaining the manufacturing method of the display device DSP.

FIG. 22 is a diagram for explaining the manufacturing method of the display device DSP.

FIG. 23 is a diagram for explaining the manufacturing method of the display device DSP.

FIG. 24 is a diagram for explaining the manufacturing method of the display device DSP.

FIG. 25 is a diagram for explaining the manufacturing method of the display device DSP.

FIG. 26 is a diagram for explaining the manufacturing method of the display device DSP.

FIG. 27 is a diagram for explaining the manufacturing method of the display device DSP.

FIG. 28 is a diagram for explaining the manufacturing method of the display device DSP.

DETAILED DESCRIPTION

Figure 2:
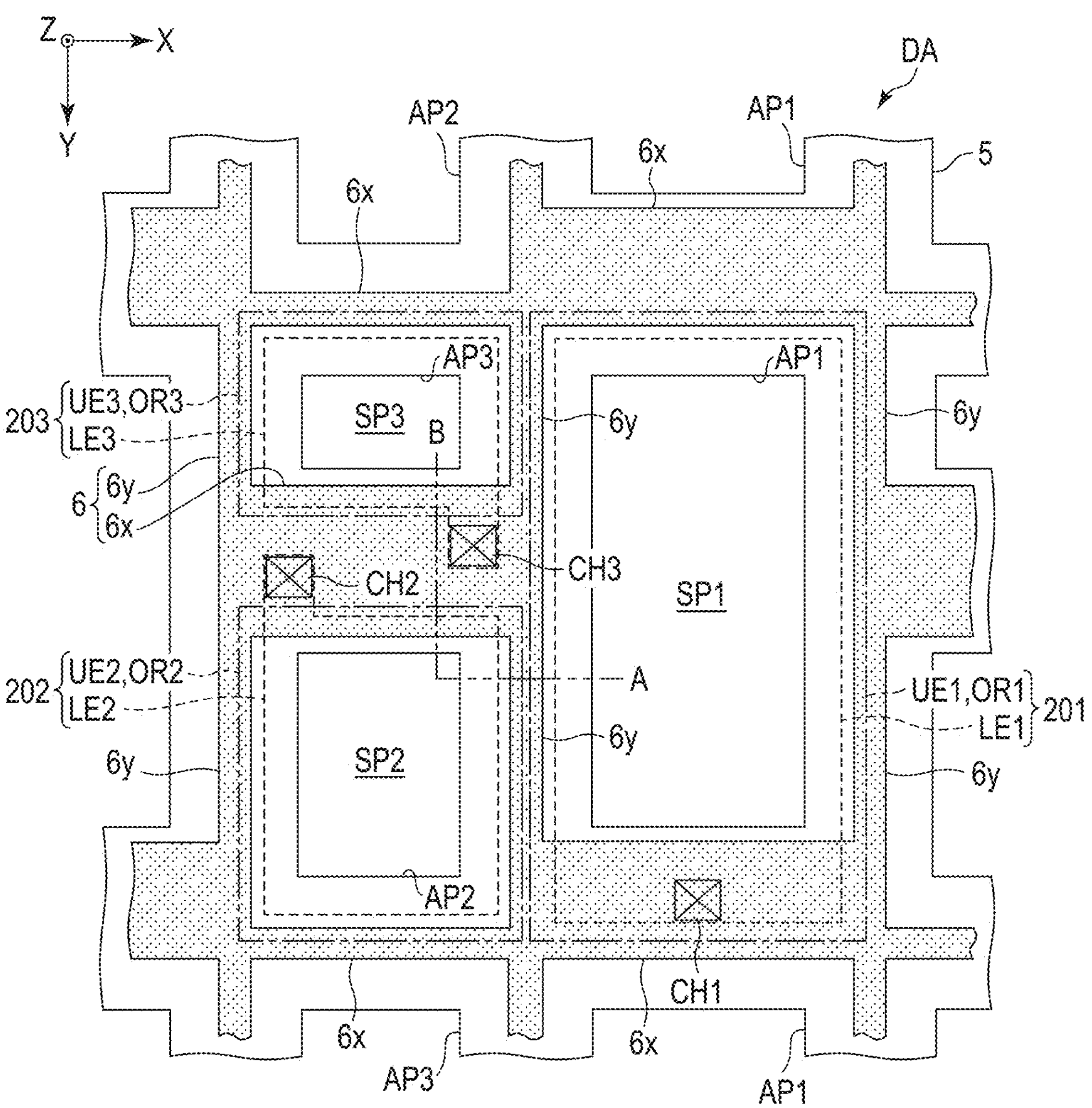
FIG. 2 is a diagram showing an example of the layout of subpixels SP1, SP2 and SP3.

Embodiments described herein aim to provide a display device which has an improved luminous efficiency and can prevent the degradation by moisture, and a manufacturing method of such a display device.

In general, according to one embodiment, a display device comprises a substrate, a lower electrode provided above the substrate, a rib formed of an inorganic insulating material and comprising an aperture which overlaps the lower electrode, a partition comprising a lower portion which is provided on the rib and is formed of a conductive material, and an upper portion which is provided on the lower portion and protrudes from a side surface of the lower portion, an organic layer provided on the lower electrode in the aperture, an upper electrode which covers the organic layer and is in contact with the lower portion of the partition, a sealing layer which covers the upper electrode and is in contact with the lower portion of the partition, and a common sealing layer formed of an inorganic insulating material and provided over a broader range than the sealing layer above the sealing layer. The sealing layer is formed of silicon nitride or a transparent oxide.

According to another embodiment, a manufacturing method of a display device comprises forming a first lower electrode and a second lower electrode above a substrate, forming a rib comprising a first aperture which overlaps the first lower electrode and a second aperture which overlaps the second lower electrode, forming a partition comprising a lower portion located on the rib between the first aperture and the second aperture, and an upper portion which is located on the lower portion and protrudes from a side surface of the lower portion, forming a first organic layer on the first lower electrode and the second lower electrode, forming a first upper electrode on the first organic layer, forming a first sealing layer which covers the first upper electrode and is in contact with the lower portion of the partition, forming a first resist on the first sealing layer immediately above the first lower electrode, removing the first sealing layer, the first upper electrode and the first organic layer using the first resist as a mask immediately above the second lower electrode, forming a second organic layer on the first sealing layer and the second lower electrode, forming a second upper electrode on the second organic layer, forming a second sealing layer which covers the second upper electrode and is in contact with the lower portion of the partition, forming a second resist on the second sealing layer immediately above the second lower electrode, removing the second sealing layer, the second upper electrode and the second organic layer using the second resist as a mask immediately above the first sealing layer, and forming a common sealing layer above the first sealing layer and the second sealing layer. Each of the first sealing layer and the second sealing layer is formed of silicon nitride or a transparent oxide. The common sealing layer is formed of an inorganic insulating material.

The embodiments can provide a display device which has an improved luminous efficiency and can prevent the degradation by moisture, and a manufacturing method of such a display device.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. When various elements are viewed parallel to the third direction Z, the appearance is defined as a plan view.

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP.

The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes subpixel SP1 which exhibits a first color, subpixel SP2 which exhibits a second color and subpixel SP3 which exhibits a third color. The first color, the second color and the third color are different colors. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the anode of the display element 20.

It should be noted that the configuration of the pixel circuit 1 is not limited to the example shown in the figure. For example, the pixel circuit 1 may comprise more thin-film transistors and capacitors.

The display element 20 is an organic light emitting diode (OLED) as a light emitting element, and may be called an organic EL element.

Although not described in detail, a terminal for connecting an IC chip and a flexible printed circuit is provided in the surrounding area SA.

FIG. 2 is a diagram showing an example of the layout of subpixels SP1, SP2 and SP3.

In the example of FIG. 2, subpixels SP2 and SP3 are arranged in the second direction Y. Further, each of subpixels SP2 and SP3 is adjacent to subpixel SP1 in the first direction X.

When subpixels SP1, SP2 and SP3 are provided in line with this layout, in the display area DA, a column in which subpixels SP2 and SP3 are alternately provided in the second direction Y and a column in which a plurality of subpixels SP1 are repeatedly provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises apertures AP1, AP2 and AP3 in subpixels SP1, SP2 and SP3, respectively.

The partition 6 overlaps the rib 5 as seen in plan view. The partition 6 comprises a plurality of first partitions 6*x* extending in the first direction X and a plurality of second partitions 6*y* extending in the second direction Y. The first partitions 6*x* are provided between the apertures AP2 and AP3 which are adjacent to each other in the second direction Y and between two apertures AP1 which are adjacent to each other in the second direction Y. Each second partition 6*y* is provided between the apertures AP1 and AP2 which are adjacent to each other in the first direction X and between the apertures AP1 and AP3 which are adjacent to each other in the first direction X.

In the example of FIG. 2, the first partitions 6*x* and the second partitions 6*y* are connected to each other. Thus, the partition 6 is formed into a grating shape surrounding the apertures AP1, AP2 and AP3 as a whole. In other words, the partition 6 comprises apertures in subpixels SP1, SP2 and SP3 in a manner similar to that of the rib 5.

Subpixels SP1, SP2 and SP3 comprise display elements 201, 202 and 203, respectively, as the display elements 20.

Subpixel SP1 comprises a lower electrode LE1, an upper electrode UE1 and an organic layer OR1 overlapping the aperture AP1. Subpixel SP2 comprises a lower electrode LE2, an upper electrode UE2 and an organic layer OR2 overlapping the aperture AP2. Subpixel SP3 comprises a lower electrode LE3, an upper electrode UE3 and an organic layer OR3 overlapping the aperture AP3.

In the example of FIG. 2, the outer shapes of the lower electrodes LE1, LE2 and LE3 are shown by dotted lines, and the outer shapes of the organic layers OR1, OR2 and OR3 and the upper electrodes UE1, UE2 and UE3 are shown by alternate long and short dash lines. The peripheral portion of each of the lower electrodes LE1, LE2 and LE3 overlaps the rib 5. It should be noted that the outer shape of each of the lower electrodes, organic layers and upper electrodes shown in the figure does not necessarily reflect the accurate shape.

The lower electrode LE1, the upper electrode UE1 and the organic layer OR1 constitute the display element 201 of subpixel SP1. The lower electrode LE2, the upper electrode UE2 and the organic layer OR2 constitute the display element 202 of subpixel SP2. The lower electrode LE3, the upper electrode UE3 and the organic layer OR3 constitute the display element 203 of subpixel SP3.

The lower electrodes LE1, LE2 and LE3 correspond to, for example, the anodes of the display elements. The upper electrodes UE1, UE2 and UE3 correspond to the cathodes of the display elements or a common electrode.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

In the example of FIG. 2, the area of the aperture AP1 is greater than that of the aperture AP2, and the area of the aperture AP2 is greater than that of the aperture AP3. In other words, the area of the lower electrode LE1 exposed from the aperture AP1 is greater than that of the lower electrode LE2 exposed from the aperture AP2. The area of the lower electrode LE2 exposed from the aperture AP2 is greater than that of the lower electrode LE3 exposed from the aperture AP3.

For example, the display element 201 of subpixel SP1 is configured to emit light in a blue wavelength range. The display element 202 of subpixel SP2 is configured to emit light in a green wavelength range. The display element 203 of subpixel SP3 is configured to emit light in a red wavelength range.

Figure 3:
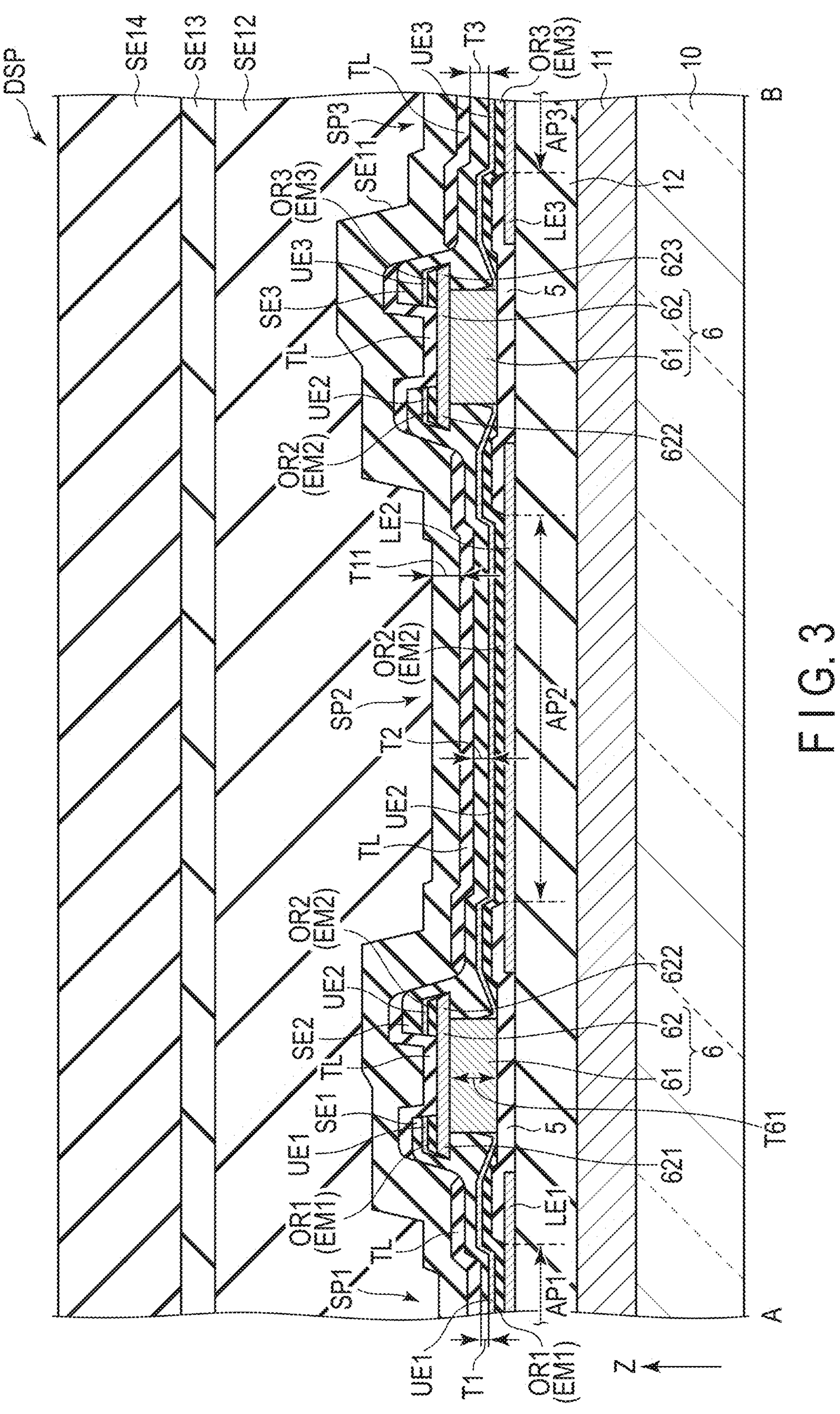
FIG. 3 is a cross-sectional view showing a configuration example of the display device DSP along the A-B line of FIG. 2.

FIG. 3 is a cross-sectional view showing a configuration example of the display device DSP along the A-B line of FIG. 2.

A circuit layer 11 is provided on the substrate 10 described above. The circuit layer 11 includes various circuits and lines such as the pixel circuit 1, scanning line GL, signal line SL and power line PL shown in FIG. 1. The circuit layer 11 is covered with an insulating layer 12. The insulating layer 12 functions as a planarization film which planarizes the irregularities formed by the circuit layer 11.

The lower electrodes LE1, LE2 and LE3 are provided on the insulating layer 12. The rib 5 is provided on the insulating layer 12 and the lower electrodes LE1, LE2 and LE3. The end portions of the lower electrodes LE1, LE2 and LE3 are covered with the rib 5. Of the lower electrodes LE1, LE2 and LE3, between the lower electrodes which are adjacent to each other, the insulating layer 12 is covered with the rib 5.

The partition 6 includes a lower portion (stem) 61 provided on the rib 5 and an upper portion (shade) 62 provided on the lower portion 61. The lower portion 61 of the partition 6 shown on the left side of the figure is located between the aperture AP1 and the aperture AP2. The lower portion 61 of the partition 6 shown on the right side of the figure is located between the aperture AP2 and the aperture AP3. The upper portion 62 has a width greater than that of the lower portion 61. By this configuration, the both end portions of the upper portion 62 protrude relative to the side surfaces of the lower portion 61. This shape of the partition 6 may be called an overhang shape. Of the upper portion 62, a portion which protrudes to the aperture AP1 relative to the lower portion 61 is referred to as a protrusion 621. A portion which protrudes to the aperture AP2 relative to the lower portion 61 is referred to as a protrusion 622. A portion which protrudes to the aperture AP3 relative to the lower portion 61 is referred to as a protrusion 623.

The organic layer OR1 is in contact with the lower electrode LE1 through the aperture AP1, covers the lower electrode LE1 and overlaps part of the rib 5. The upper electrode UE1 faces the lower electrode LE1 and is provided on the organic layer OR1. Further, the upper electrode UE1 is in contact with a side surface of the lower portion 61. The organic layer OR1 and the upper electrode UE1 are located on the lower side relative to the upper portion 62.

The organic layer OR2 is in contact with the lower electrode LE2 through the aperture AP2, covers the lower electrode LE2 and overlaps part of the rib 5. The upper electrode UE2 faces the lower electrode LE2 and is provided on the organic layer OR2. Further, the upper electrode UE2 is in contact with a side surface of the lower portion 61. The organic layer OR2 and the upper electrode UE2 are located on the lower side relative to the upper portion 62.

The organic layer OR3 is in contact with the lower electrode LE3 through the aperture AP3, covers the lower electrode LE3 and overlaps part of the rib 5. The upper electrode UE3 faces the lower electrode LE3 and is provided on the organic layer OR3. Further, the upper electrode UE3 is in contact with a side surface of the lower portion 61. The organic layer OR3 and the upper electrode UE3 are located on the lower side relative to the upper portion 62.

Sealing layers SE1, SE2 and SE3 are provided in subpixels SP1, SP2 and SP3, respectively, and a transparent layer TL is also provided in each of subpixels SP1, SP2 and SP3.

The sealing layer SE1 is located in subpixel SP1, covers the upper electrode UE1 and is in contact with the lower and upper portions 61 and 62 of the partition 6 under the protrusion 621.

The sealing layer SE2 is located in subpixel SP2, covers the upper electrode UE2 and is in contact with the lower and upper portions 61 and 62 of the partition 6 under the protrusion 622.

The sealing layer SE3 is located in subpixel SP3, covers the upper electrode UE3 and is in contact with the lower and upper portions 61 and 62 of the partition 6 under the protrusion 623.

In the example shown in the figure, the end portions of the sealing layers SE1, SE2 and SE3 are located above the partition 6.

Part of the organic layer OR1 and part of the upper electrode UE1 are located between the partition 6 and the sealing layer SE1, are provided such that the upper portion 62 is partly exposed, and are spaced apart from the portions located on the lower side relative to the upper portion 62.

Part of the organic layer OR2 and part of the upper electrode UE2 are located between the partition 6 and the sealing layer SE2, are provided such that the upper portion 62 is partly exposed, and are spaced apart from the portions located on the lower side relative to the upper portion 62.

Part of the organic layer OR3 and part of the upper electrode UE3 are located between the partition 6 and the sealing layer SE3, are provided such that the upper portion 62 is partly exposed, and are spaced apart from the portions located on the lower side relative to the upper portion 62.

Immediately above the partition 6 between subpixels SP1 and SP2, the organic layer OR1 is spaced apart from the organic layer OR2, and the upper electrode UE1 is spaced apart from the upper electrode UE2, and the sealing layer SE1 is spaced apart from the sealing layer SE2.

Immediately above the partition 6 between subpixels SP2 and SP3, the organic layer OR2 is spaced apart from the organic layer OR3, and the upper electrode UE2 is spaced apart from the upper electrode UE3, and the sealing layer SE2 is spaced apart from the sealing layer SE3.

The transparent layer TL is provided on each of the sealing layers SE1, SE2 and SE3. The transparent layer TL is provided on the partition 6 and is in contact with the upper portion 62.

Immediately above the partition 6 between subpixels SP1 and SP2, the transparent layer TL is provided between the organic layer OR1 and the organic layer OR2, between the upper electrode UE1 and the upper electrode UE2 and between the sealing layer SE1 and the sealing layer SE2, and is in contact with the upper portion 62.

Immediately above the partition 6 between subpixels SP2 and SP3, the transparent layer TL is provided between the organic layer OR2 and the organic layer OR3, between the upper electrode UE2 and the upper electrode UE3 and between the sealing layer SE2 and the sealing layer SE3, and is in contact with the upper portion 62.

In subpixel SP1, the stacked layer body consisting of the sealing layer SE1 and the transparent layer TL functions as an optical adjustment layer for adjusting the optical property of the light emitted from the light emitting layer of the organic layer OR1.

Similarly, the stacked layer body consisting of the sealing layer SE2 and the transparent layer TL in subpixel SP2 and the stacked layer body consisting of the sealing layer SE3 and the transparent layer TL in subpixel SP3 function as optical adjustment layers.

A common sealing layer SE11 is continuously provided over subpixels SP1, SP2 and SP3. In other words, the common sealing layer SE11 is located above the sealing layers SE1, SE2 and SE3, covers the transparent layer TL and is provided over a broader range than each of the sealing layers SE1, SE2 and SE3.

A common sealing layer SE12 is provided on the common sealing layer SE11.

A common sealing layer SE13 is provided on the common sealing layer SE12.

A common sealing layer SE14 is provided on the common sealing layer SE13.

The insulating layer 12, the common sealing layer SE12 and the common sealing layer SE14 are organic insulating layers. The rib 5, the common sealing layer SE11 and the common sealing layer SE13 are inorganic insulating layers.

The rib 5 is formed of silicon nitride (SiNx) as an example of inorganic insulating materials. It should be noted that the rib 5 may be formed of, as another inorganic insulating material, a single-layer body of one of silicon oxide (SiOx), silicon oxynitride (SiON) and aluminum oxide ($Al_2O_3$). The rib 5 may be formed of a stacked layer body of a combination consisting of at least two of a silicon nitride layer, a silicon oxide layer, a silicon oxynitride layer and an aluminum oxide layer.

The thickness of the rib 5 is sufficiently less than that of each of the partition 6 and the insulating layer 12. For example, the thickness of the rib 5 is greater than or equal to 200 nm but less than or equal to 400 nm.

Thickness T61 of the lower portion 61 of the partition 6 (the thickness from the upper surface of the rib 5 to the lower surface of the upper portion 62) is greater than the thickness of the rib 5.

The sealing layers SE1, SE2 and SE3 are formed of, for example, the same material.

Each of the sealing layers SE1, SE2 and SE3 is formed of, for example, an inorganic insulating material such as silicon nitride (SiNx).

Alternatively, each of the sealing layers SE1, SE2 and SE3 may be formed of a transparent oxide such as indium zinc oxide (IZO) or indium tin oxide (ITO).

Thickness T1 of the sealing layer SE1, thickness T2 of the sealing layer SE2 and thickness T3 of the sealing layer SE3 are different from each other and less than or equal to 1 μm. For example, thickness T2 is greater than thickness T1 ($T1<T2$), and thickness T3 is greater than thickness T2 ($T2<T3$). Thicknesses T1, T2 and T3 are less than thickness T61 of the lower portion 61 ($T1, T2, T3<T61$). Thicknesses T1, T2 and T3 are less than thickness T11 of the common sealing layer SE11 ($T1, T2, T3<T11$).

The transparent layer TL is formed of, for example, an inorganic fluoride such as lithium fluoride (LiF) or magnesium fluoride (MgF). The refractive index of the transparent layer TL is less than the refractive indices of the sealing layers SE1, SE2 and SE3. In other words, the transparent layer TL corresponds to the low-refractive layer of each optical adjustment layer, and each of the sealing layers SE1, SE2 and SE3 corresponds to the high-refractive layer of the optical adjustment layer. The difference between the refractive index of the transparent layer TL and the refractive index of each of the sealing layers SE1, SE2 and SE3 is greater than or equal to 0.2.

Each of the common sealing layer SE11 and the common sealing layer SE13 is formed of, for example, an inorganic insulating material such as silicon nitride (SiNx) or silicon oxynitride (SiON). In this case, the refractive index of the common sealing layer SE11 is greater than that of the transparent layer TL.

It should be noted that each of the common sealing layer SE11 and the common sealing layer SE13 may be formed of, as another inorganic insulating material, silicon oxide (SiOx) or aluminum oxide ($Al_2O_3$). The common sealing layer SE11 and the common sealing layer SE13 may be formed of inorganic insulating materials which are different from each other.

The lower portion 61 of the partition 6 is formed of a conductive material and is electrically connected to the upper electrodes UE1, UE2 and UE3. The upper portion 62 of the partition 6 may be also formed of a conductive material. When each of the sealing layers SE1, SE2 and SE3 is formed of a conductive material such as IZO, the sealing layers SE1, SE2 and SE3 are in contact with the lower portions 61 and the upper electrodes UE1, UE2 and UE3, respectively, and can support the electrical connection between the lower portions and the upper electrodes.

Each of the lower electrodes LE1, LE2 and LE3 is formed of a stacked layer body consisting of a metal layer (reflective electrode) formed of silver (Ag), etc., and a transparent conductive layer formed of ITO, etc. Each of the upper electrodes UE1, UE2 and UE3 is formed of, for example, a metal material such as an alloy of magnesium and silver (MgAg).

The organic layer OR1 includes a light emitting layer EM1. The organic layer OR2 includes a light emitting layer EM2. The organic layer OR3 includes a light emitting layer EM3. The light emitting layer EM1, the light emitting layer EM2 and the light emitting layer EM3 are formed of materials which are different from each other.

The material of the light emitting layer EM1, the material of the light emitting layer EM2 and the material of the light emitting layer EM3 are materials which emit light in different wavelength ranges. For example, the light emitting layer EM1 is formed of a material which emits light in a blue wavelength range. The light emitting layer EM2 is formed of a material which emits light in a green wavelength range. The light emitting layer EM3 is formed of a material which emits light in a red wavelength range.

Common voltage is applied to the partition 6. This common voltage is applied to each of the upper electrodes UE1, UE2 and UE3 which are in contact with the side surfaces of the lower portions 61. Pixel voltage is applied to the lower electrodes LE1, LE2 and LE3 through the pixel circuits 1 provided in subpixels SP1, SP2 and SP3, respectively.

When a potential difference is formed between the lower electrode LE1 and the upper electrode UE1, the light emitting layer EM1 of the organic layer OR1 emits light in a blue wavelength range. When a potential difference is formed between the lower electrode LE2 and the upper electrode UE2, the light emitting layer EM2 of the organic layer OR2 emits light in a green wavelength range. When a potential difference is formed between the lower electrode LE3 and the upper electrode UE3, the light emitting layer EM3 of the organic layer OR3 emits light in a red wavelength range.

FIG. 4 is a diagram showing the configurations of the display elements 201 to 203 shown in FIG. 3.

Here, in the example, this specification assumes that each lower electrode corresponds to an anode and each upper electrode corresponds to a cathode.

The display element 201 includes the organic layer OR1 between the lower electrode LE1 and the upper electrode UE1.

In the organic layer OR1, a hole injection layer HIL1, a hole transport layer HTL1, an electron blocking layer EBL1, the light emitting layer EM1 which exhibits blue (B), a hole blocking layer HBL1, an electron transport layer ETL1 and an electron injection layer EIL1 are stacked in this order.

The sealing layer SE1 which is a high-refractive layer is provided on the upper electrode UE1. The transparent layer TL which is a low-refractive layer is provided on the sealing layer SE1. The common sealing layer SE11 is provided on the transparent layer TL.

The display element 202 includes the organic layer OR2 between the lower electrode LE2 and the upper electrode UE2.

In the organic layer OR2, a hole injection layer HIL2, a hole transport layer HTL2, an electron blocking layer EBL2, the light emitting layer EM2 which exhibits green (G), a hole blocking layer HBL2, an electron transport layer ETL2 and an electron injection layer EIL2 are stacked in this order.

The sealing layer SE2 which is a high-refractive layer is provided on the upper electrode UE2. The transparent layer TL which is a low-refractive layer is provided on the sealing layer SE2. The common sealing layer SE11 is provided on the transparent layer TL.

As described above, thickness T2 of the sealing layer SE2 is greater than thickness T1 of the sealing layer SE1. The thickness of the transparent layer TL which overlaps the sealing layer SE2 is equal to that of the transparent layer TL which overlaps the sealing layer SE1.

The display element 203 includes the organic layer OR3 between the lower electrode LE3 and the upper electrode UE3.

In the organic layer OR3, a hole injection layer HIL3, a hole transport layer HTL3, an electron blocking layer EBL3, the light emitting layer EM3 which exhibits red (R), a hole blocking layer HBL3, an electron transport layer ETL3 and an electron injection layer EIL3 are stacked in this order.

The sealing layer SE3 which is a high-refractive layer is provided on the upper electrode UE3. The transparent layer TL which is a low-refractive layer is provided on the sealing layer SE3. The common sealing layer SE11 is provided on the transparent layer TL.

As described above, thickness T3 of the sealing layer SE3 is greater than thickness T2 of the sealing layer SE2. The thickness of the transparent layer TL which overlaps the sealing layer SE3 is equal to that of the transparent layer TL which overlaps the sealing layer SE2.

For example, the refractive index of each of the sealing layers SE1, SE2 and SE3 is greater than or equal to 1.7, and the refractive index of the transparent layer TL is less than or equal to 1.6. The refractive index of the common sealing layer SE11 is greater than or equal to 1.7.

It should be noted that each of the organic layers OR1, OR2 and OR3 may include, in addition to the functional layers described above, other functional layers such as a carrier generation layer as needed, or at least one of the above functional layers may be omitted.

The above functional layers are individually formed for each of the display elements 201 to 203. Thus, the thickness of each of the above functional layers may differ depending on the display element.

When this specification focuses attention on the same functional layer, the functional layer of one of the display elements 201 to 203 may be formed of a material different from the materials of the functional layers of the other two display elements, or all of the functional layers of the display elements 201 to 203 may be formed of materials which are different from each other.

Further, the layer structure of one of the display elements 201 to 203 may be different from the layer structures of the other two display elements, or all of the layer structures of the display elements 201 to 203 may be different from each other. For example, when this specification focuses attention on one of the functional layers, one of the display elements 201 to 203 may not include this functional layer, or only one of the display elements 201 to 203 may include the functional layer. When this specification focuses attention on one of the functional layers, for example, this functional layer may comprise a multilayer structure in one of the display elements 201 to 203.

According to the configuration example shown in FIG. 3 and FIG. 4, the display elements 201 to 203 comprise the sealing layers SE1, SE2 and SE3 which function as optical adjustment layers, respectively, and the transparent layer TL which also functions as an optical adjustment layer. Thus, the light emitted from each of the light emitting layers EM1 to EM3 is reflected on the interface between the sealing layer and the transparent layer and is reflected on the upper electrode again. By the microcavity effect using such interference of reflected light, the luminous efficiency of each display element can be improved.

The lithium fluoride which is an example of the material of the transparent layer TL is very hygroscopic. The transparent layer TL is a common layer provided over subpixels SP1, SP2 and SP3 and does not require processing such as photolithography. The transparent layer TL is sealed with the sealing layers SE1, SE2 and SE3 and the common sealing layer SE11. This configuration can prevent the degradation of the transparent layer TL by moisture.

Figure 5:
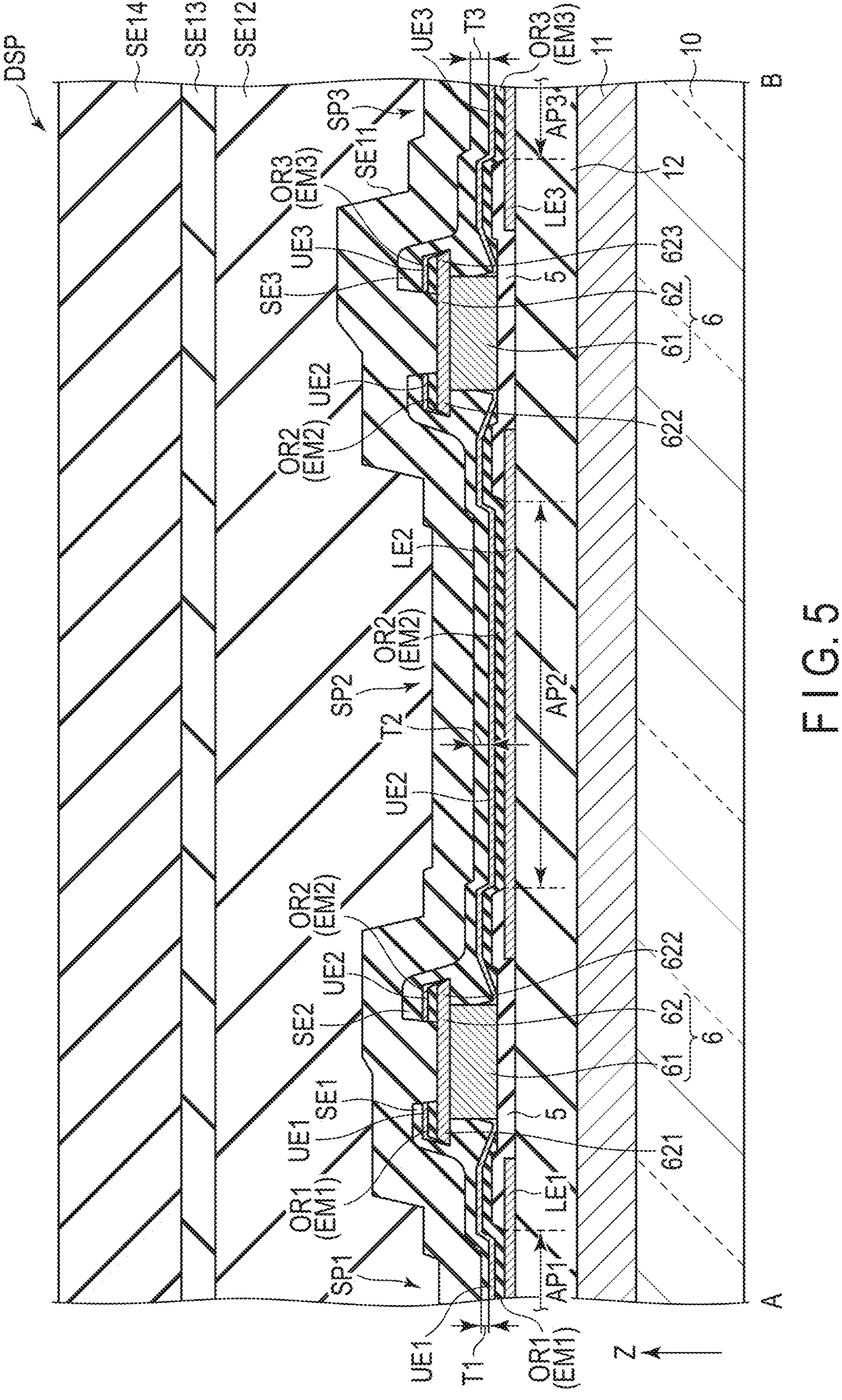
FIG. 5 is a cross-sectional view showing another configuration example of the display device DSP along the A-B line of FIG. 2.

FIG. 5 is a cross-sectional view showing another configuration example of the display device DSP along the A-B line of FIG. 2.

The cross-sectional structure of the display device DSP shown in FIG. 5 is different from the display device DSP shown in FIG. 3 in respect that the transparent layer TL is omitted. Main differences are explained below.

The sealing layer SE1 is located in subpixel SP1, covers the upper electrode UE1 and is in contact with the lower and upper portions 61 and 62 of the partition 6.

The sealing layer SE2 is located in subpixel SP2, covers the upper electrode UE2 and is in contact with the lower and upper portions 61 and 62 of the partition 6.

The sealing layer SE3 is located in subpixel SP3, covers the upper electrode UE3 and is in contact with the lower and upper portions 61 and 62 of the partition 6.

The common sealing layer SE11 is continuously provided over subpixels SP1, SP2 and SP3. The common sealing layer SE11 directly covers the sealing layers SE1, SE2 and SE3 and is provided over a broader range than each of the sealing layers SE1, SE2 and SE3. The common sealing layer SE11 is provided on the partition 6 and is in contact with the upper portion 62.

Immediately above the partition 6 between subpixels SP1 and SP2, the common sealing layer SE11 is provided between the organic layer OR1 and the organic layer OR2, between the upper electrode UE1 and the upper electrode UE2 and between the sealing layer SE1 and the sealing layer SE2, and is in contact with the upper portion 62.

Immediately above the partition 6 between subpixels SP2 and SP3, the common sealing layer SE11 is provided between the organic layer OR2 and the organic layer OR3, between the upper electrode UE2 and the upper electrode UE3 and between the sealing layer SE2 and the sealing layer SE3, and is in contact with the upper portion 62.

In subpixel SP1, the stacked layer body consisting of the sealing layer SE1 and the common sealing layer SE11 functions as an optical adjustment layer for adjusting the optical property of the light emitted from the light emitting layer of the organic layer OR1.

Similarly, the stacked layer body consisting of the sealing layer SE2 and the common sealing layer SE11 in subpixel SP2 and the stacked layer body consisting of the sealing layer SE3 and the common sealing layer SE11 in subpixel SP3 function as optical adjustment layers.

The common sealing layer SE12 is provided on the common sealing layer SE11.

The common sealing layer SE13 is provided on the common sealing layer SE12.

The common sealing layer SE14 is provided on the common sealing layer SE13.

Each of the sealing layers SE1, SE2 and SE3 is formed of, for example, an inorganic insulating material such as silicon nitride (SiNx). Alternatively, each of the sealing layers SE1, SE2 and SE3 may be formed of a transparent oxide such as indium zinc oxide (IZO) or indium tin oxide (ITO).

The common sealing layer SE11 is formed of, for example, an inorganic insulating material such as silicon oxide (SiOx) or silicon oxynitride (SiON). In this case, the refractive index of the common sealing layer SE11 is less than the refractive indices of the sealing layers SE1, SE2 and SE3. In other words, the common sealing layer SE11 corresponds to the low-refractive layer of each optical adjustment layer, and each of the sealing layers SE1, SE2 and SE3 corresponds to the high-refractive layer of the optical adjustment layer. The difference between the refractive index of the common sealing layer SE11 and the refractive indices of the sealing layers SE1, SE2 and SE3 is greater than or equal to 0.2.

FIG. 6 is a diagram showing the configurations of the display elements 201 to 203 shown in FIG. 5.

Here, in the example, this specification assumes that each lower electrode corresponds to an anode and each upper electrode corresponds to a cathode.

The display element 201 includes the organic layer OR1 between the lower electrode LE1 and the upper electrode UE1.

The sealing layer SE1 which is a high-refractive layer is provided on the upper electrode UE1. The common sealing layer SE11 which is a low-refractive layer is provided on the sealing layer SE1.

The display element 202 includes the organic layer OR2 between the lower electrode LE2 and the upper electrode UE2.

The sealing layer SE2 which is a high-refractive layer is provided on the upper electrode UE2. The common sealing layer SE11 which is a low-refractive layer is provided on the sealing layer SE2.

The display element 203 includes the organic layer OR3 between the lower electrode LE3 and the upper electrode UE3.

The sealing layer SE3 which is a high-refractive layer is provided on the upper electrode UE3. The common sealing layer SE11 which is a low-refractive layer is provided on the sealing layer SE3.

Thickness T2 of the sealing layer SE2 is greater than thickness T1 of the sealing layer SE1. Thickness T3 of the sealing layer SE3 is greater than thickness T2 of the sealing layer SE2. The thickness of the common sealing layer SE11 which overlaps the sealing layer SE1, the thickness of the common sealing layer SE11 which overlaps the sealing layer SE2 and the thickness of the common sealing layer SE11 which overlaps the sealing layer SE3 are equal to each other.

For example, the refractive index of each of the sealing layers SE1, SE2 and SE3 is greater than or equal to 1.7, and the refractive index of the common sealing layer SE11 is less than or equal to 1.6.

According to the configuration example shown in FIG. 5 and FIG. 6, the display elements 201 to 203 comprise the sealing layers SE1, SE2 and SE3 which function as optical adjustment layers, respectively, and the common sealing layer SE11 which also functions as an optical adjustment layer. Thus, the light emitted from each of the light emitting layers EM1 to EM3 is reflected on the interface between the sealing layer and the common sealing layer and is reflected on the upper electrode again. By the microcavity effect using such interference of reflected light, the luminous efficiency of each display element can be improved.

It should be noted that the transparent layer TL explained in the configuration example of FIG. 3 is omitted. Thus, the problems caused by the characteristics of the transparent layer TL are solved. Further, the configurations of the display elements 201 to 203 are simplified. Therefore, the manufacturing cost can be reduced.

FIG. 7 is a diagram showing the simulation results of the blue luminous efficiency relative to the thickness regarding the high-refractive layer of the optical adjustment layer provided in the display element 201.

In the figure, the horizontal axis represents the thickness (nm) of the high-refractive layer, and the vertical axis represents a value (cd/A/y) obtained by dividing the blue luminous efficiency (cd/A) by the y-value of the blue chromaticity. This value is called a blue index (BI value). Here, the blue luminous efficiency (cd/A) is shown as the luminance of the display device DSP in the frontal direction per unit current (current luminance efficiency). In the case of blue emission of different chromaticities, the luminous efficiencies (cd/A) cannot be simply compared in terms of the effect of the luminosity factor. The luminous efficiencies of blue emission of different chromaticities can be simply compared with each other based on the BI values by dividing the blue luminous efficiency (cd/A) by the y-value of the blue chromaticity.

In the present embodiment, the high-refractive layer corresponds to the sealing layer SE1 shown in FIG. 3 and FIG. 5.

In FIG. 7, "A" corresponds to the simulation result of a case where the high-refractive layer is formed of an organic material (corresponding to a comparative example).

In the figure, "B" corresponds to the simulation result of a case where the high-refractive layer is formed of SiN (corresponding to the present embodiment).

In the figure, "C" corresponds to the simulation result of a case where the high-refractive layer is formed of IZO (corresponding to the present embodiment).

According to these simulation results, it was confirmed that, even when the high-refractive layer was formed of SiN or IZO, a luminous efficiency which was equal to that of a case where the high-refractive layer was formed of an organic material could be obtained.

In other words, in the present embodiment in which the high-refractive layer is formed of SiN, compared with a case where the high-refractive layer is formed of an organic material, an equal luminous efficiency is obtained, and further, the sealing layer SE1 having a high sealing performance for moisture is obtained.

In the present embodiment in which the high-refractive layer is formed of IZO, compared with a case where the high-refractive layer is formed of an organic material, an equal luminous efficiency is obtained, and further, the sealing layer SE1 having a high sealing performance for moisture is obtained. In addition, since the high-refractive layer formed of IZO is conductive, the high-refractive layer can support the electrical connection between the upper electrode UE1 and the lower portion 61 of the partition 6.

Now, an example of the manufacturing method of the display device DSP shown in FIG. 3 is explained with reference to FIG. 8 and FIG. 9.

Figure 8:
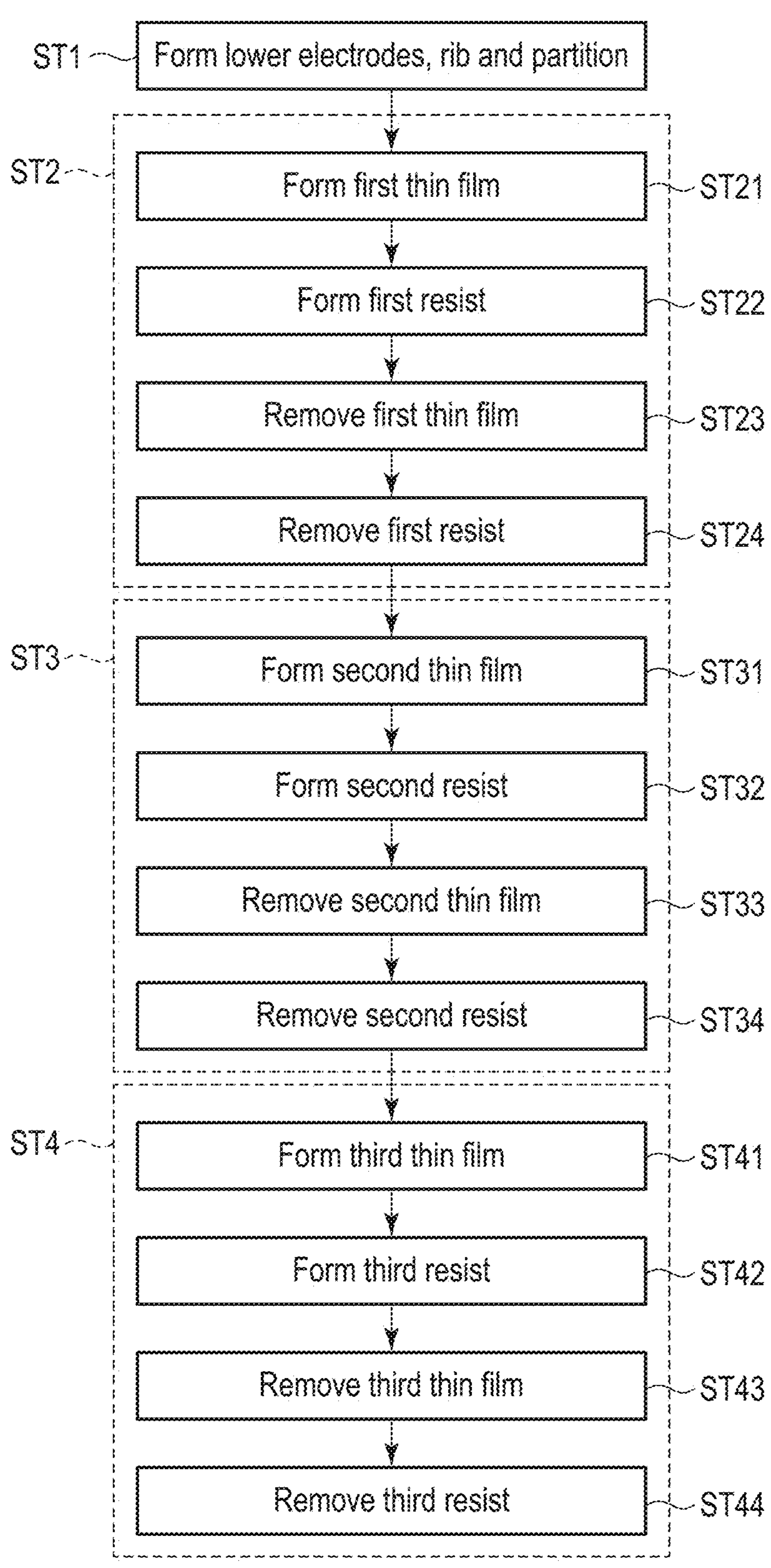
FIG. 8 is a flow diagram for explaining an example of the manufacturing method of the display device DSP.

First, as shown in FIG. 8, in step ST1, the lower electrode LE1 of subpixel SP1, the lower electrode LE2 of subpixel SP2, the lower electrode LE3 of subpixel SP3, the rib 5 and the partition 6 are formed on the substrate 10. As shown in FIG. 3, the circuit layer 11 and the insulating layer 12 are also formed between the substrate 10 and the lower electrodes LE1, LE2 and LE3.

In step ST2, first, a first thin film 31 including the light emitting layer EM1 is formed over subpixel SP1, subpixel SP2 and subpixel SP3 (step ST21). The first thin film 31 is a stacked layer body consisting of the organic layer OR1, upper electrode UE1 and sealing layer SE1 shown in FIG. 3. Subsequently, a first resist 41 patterned into a predetermined shape is formed on the first thin film 31 (step ST22). Subsequently, part of the first thin film 31 is removed by etching using the first resist 41 as a mask (step ST23). At this time, for example, the first thin film 31 provided in subpixel SP2 and subpixel SP3 is removed. Subsequently, the first resist 41 is removed (step ST24). In this manner, subpixel SP1 is formed. Subpixel SP1 comprises the display element 201 comprising the first thin film 31 having a predetermined shape.

In step ST3, first, a second thin film 32 including the light emitting layer EM2 is formed over subpixel SP1, subpixel SP2 and subpixel SP3 (step ST31). The second thin film 32 is a stacked layer body consisting of the organic layer OR2, upper electrode UE2 and sealing layer SE2 shown in FIG. 3. Subsequently, a second resist 42 patterned into a predetermined shape is formed on the second thin film 32 (step ST32). Subsequently, part of the second thin film 32 is removed by etching using the second resist 42 as a mask (step ST33). At this time, for example, the second thin film 32 provided in subpixel SP1 and subpixel SP3 is removed. Subsequently, the second resist 42 is removed (step ST34). In this manner, subpixel SP2 is formed. Subpixel SP2 comprises the display element 202 comprising the second thin film 32 having a predetermined shape.

In step ST4, first, a third thin film 33 including the light emitting layer EM3 is formed over subpixel SP1, subpixel SP2 and subpixel SP3 (step ST41). The third thin film 33 is a stacked layer body consisting of the organic layer OR3, upper electrode UE3 and sealing layer SE3 shown in FIG. 3. Subsequently, a third resist 43 patterned into a predetermined shape is formed on the third thin film 33 (step ST42). Subsequently, part of the third thin film 33 is removed by etching using the third resist 43 as a mask (step ST43). At this time, for example, the third thin film 33 provided in subpixel SP1 and subpixel SP2 is removed. Subsequently, the third resist 43 is removed (step ST44). In this manner, subpixel SP3 is formed. Subpixel SP3 comprises the display element 203 comprising the third thin film 33 having a predetermined shape.

Subsequently, as shown in FIG. 9, the thicknesses of the sealing layers SE1, SE2 and SE3 are reduced by performing etching for the sealing layers SE1, SE2 and SE3 (step ST51).

Subsequently, the transparent layer TL is formed on the sealing layers SE1, SE2 and SE3 (step ST52).

Subsequently, the common sealing layer SE11 which covers the transparent layer TL is formed (step ST53).

Subsequently, the common sealing layer SE12 is formed on the common sealing layer SE11 (step ST54).

Subsequently, the common sealing layer SE13 is formed on the common sealing layer SE12 (step ST55).

Subsequently, the common sealing layer SE14 is formed on the common sealing layer SE13 (step ST56).

FIG. 10 is a flow diagram for explaining an example of the manufacturing method of the display device DSP shown in FIG. 5.

After steps ST1 to ST4 shown in FIG. 8, the thicknesses of the sealing layers SE1, SE2 and SE3 are reduced by performing etching for the sealing layers SE1, SE2 and SE3 (step ST51).

Subsequently, the common sealing layer SE11 is formed on the sealing layers SE1, SE2 and SE3 (step ST53). Subsequently, the common sealing layer SE12 is formed (step ST54), and the common sealing layer SE13 is formed (step ST55), and the common sealing layer SE14 is formed (step ST56).

Now, the manufacturing method of the display device DSP shown in FIG. 3 is explained with reference to FIG. 11 to FIG. 24. The section shown in each of FIG. 11 to FIG. 24 corresponds to, for example, the section taken along the A-B line of FIG. 2 and including subpixels SP1 and SP2. In each of FIG. 11 to FIG. 24, the illustrations of the substrate 10 and the circuit layer 11 lower than the insulating layer 12 are omitted.

First, in step ST1, as shown in FIG. 11, the lower electrode LE1 of subpixel SP1 and the lower electrode LE2 of subpixel SP2 are formed after the circuit layer 11 and the insulating layer 12 are formed on the substrate 10. Although not shown in the figure, at this time, the lower electrode LE3 of subpixel SP3 is also formed. Subsequently, the rib 5 comprising the apertures AP1 and AP2 overlapping the lower electrodes LE1 and LE2, respectively, is formed. Subsequently, the partition 6 comprising the lower portion 61 located on the rib 5 between the apertures AP1 and AP2 and the upper portion 62 which is located on the lower portion 61 and protrudes from the side surfaces of the lower portion 61 is formed.

Subsequently, in step ST2, the first thin film 31 is formed over subpixel SP1 and subpixel SP2. Further, the first thin film 31 is also formed in subpixel SP3 (not shown). The process of forming the first thin film 31 includes the process of forming the organic layer OR1 including the light emitting layer EM1, the process of forming the upper electrode UE1 on the organic layer OR1 and the process of forming the sealing layer SE1 on the upper electrode UE1.

The organic layer OR1 is formed on each of the lower electrode LE1 and the lower electrode LE2 and is also formed on the partition 6. Of the organic layer OR1, the portion formed on the upper portion 62 is spaced apart from the portion formed on each of the lower electrodes LE1 and LE2.

The upper electrode UE1 is formed on the organic layer OR1 immediately above each of the lower electrodes LE1 and LE2, covers the rib 5 and is in contact with the lower portion 61 of the partition 6. The upper electrode UE1 is also formed on the organic layer OR1 immediately above the upper portion 62. Of the upper electrode UE1, the portion which is formed immediately above the upper portion 62 is spaced apart from the portion which is formed immediately above each of the lower electrodes LE1 and LE2.

The sealing layer SE1 is formed so as to cover the upper electrode UE1 immediately above the lower electrode LE1 and the lower electrode LE2. The sealing layer SE1 is formed so as to cover the upper electrode UE1 immediately above the upper portion 62 of the partition 6 and is in contact with the lower portion 61 of the partition 6. In the sealing layer SE1, the portion which is formed immediately above the upper portion 62 is continuous with the portion which is formed immediately above each of the lower electrodes. The sealing layer SE1 is formed of, for example, silicon nitride. The sealing layer SE1 is formed by, for example, a CVD method.

Subsequently, in step ST22, as shown in FIG. 12, the patterned first resist 41 is formed on the sealing layer SE1. The first thin film 31 of subpixel SP1 is covered with the first resist 41. The first thin film 31 of subpixel SP2 is exposed from the first resist 41. It should be noted that the first thin film 31 of subpixel SP3 is also exposed from the first resist 41. Thus, the first resist 41 overlaps the sealing layer SE1 located immediately above the lower electrode LE1.

Subsequently, in step ST23, as shown in FIG. 13, etching is applied using the first resist 41 as a mask. By this process, the first thin film 31 exposed from the first resist 41 in subpixel SP2 is removed, and the first thin film 31 remains in subpixel SP1. At this time, the first thin film 31 exposed from the first resist 41 in subpixel SP3 is also removed.

The process of removing the first thin film 31 is, for example, as follows.

First, dry etching is performed using the first resist 41 as a mask to remove the sealing layer SE1 exposed from the first resist 41.

Subsequently, wet etching is performed using the first resist 41 as a mask to remove the upper electrode UE1 exposed from the sealing layer SE1.

Subsequently, asking (dry etching for emitting an oxygen plasma) is performed using the first resist 41 as a mask to remove the organic layer OR1 exposed from the upper electrode UE1.

In this manner, the lower electrode LE2 is exposed in subpixel SP2, and the rib 5 surrounding the lower electrode LE2 is exposed. On the partition 6 between subpixel SP1 and subpixel SP2, the subpixel SP2 side is exposed.

Subsequently, in step ST24, as shown in FIG. 14, the first resist 41 is removed. By this process, the sealing layer SE1 of subpixel SP1 is exposed. Through these steps ST21 to ST24, the display element 201 is formed in subpixel SP1. The display element 201 includes the lower electrode LE1, the organic layer OR1 including the light emitting layer EM1, and the upper electrode UE1. The display element 201 is covered with the sealing layer SE1.

Subsequently, in step ST31, as shown in FIG. 15, the second thin film 32 is formed over subpixel SP1 and subpixel SP2. Further, the second thin film 32 is also formed in subpixel SP3 (not shown). The process of forming the second thin film 32 includes the process of forming the organic layer OR2 including the light emitting layer EM2, the process of forming the upper electrode UE2 on the organic layer OR2 and the process of forming the sealing layer SE2 on the upper electrode UE2. The sealing layer SE2 is formed so as to have a different thickness from the first sealing layer SE1.

The organic layer OR2 is formed on each of the sealing layer SE1 and the lower electrode LE2 and is also formed on the partition 6. Of the organic layer OR2, the portion formed on the upper portion 62 is spaced apart from the portion formed on the lower electrode LE2.

The upper electrode UE2 is formed on the organic layer OR2 immediately above each of the sealing layer SE1 and the lower electrode LE2, covers the rib 5 and is in contact with the lower portion 61 of the partition 6 on the subpixel SP2 side. The upper electrode UE2 is also formed on the organic layer OR2 immediately above the upper portion 62. Of the upper electrode UE2, the portion which is formed immediately above the upper portion 62 is spaced apart from the portion which is formed immediately above the lower electrode LE2.

The sealing layer SE2 is formed so as to cover the upper electrode UE2 immediately above the sealing layer SE1 and the lower electrode LE2. The sealing layer SE2 is formed so as to cover the upper electrode UE2 immediately above the upper portion 62 of the partition 6 and is in contact with the lower portion 61 of the partition 6 on the subpixel SP2 side. In the sealing layer SE2, the portion which is formed immediately above the upper portion 62 is continuous with the portion which is formed immediately above each of the sealing layer SE1 and the lower electrode LE2. The sealing layer SE2 is formed of, for example, silicon nitride. The sealing layer SE2 is formed by, for example, a CVD method.

Subsequently, in step ST32, as shown in FIG. 16, the patterned second resist 42 is formed on the sealing layer SE2. The second thin film 32 of subpixel SP2 is covered with the second resist 42. The second thin film 32 of subpixel SP1 is exposed from the second resist 42. It should be noted that the second thin film 32 of subpixel SP3 is also exposed from the second resist 42. Thus, the second resist 42 overlaps the sealing layer SE2 located immediately above the lower electrode LE2.

Subsequently, in step ST33, as shown in FIG. 17, etching is applied using the second resist 42 as a mask. By this process, the second thin film 32 exposed from the second resist 42 in subpixels SP1 is removed, and the second thin film 32 remains in subpixel SP2. At this time, the second thin film 32 exposed from the second resist 42 in subpixel SP3 is also removed.

The process of removing the second thin film 32 is, for example, as follows.

First, dry etching is performed using the second resist 42 as a mask to remove the sealing layer SE2 exposed from the second resist 42.

Subsequently, wet etching is performed using the second resist 42 as a mask to remove the upper electrode UE2 exposed from the sealing layer SE2.

Subsequently, asking is performed using the second resist 42 as a mask to remove the organic layer OR2 exposed from the upper electrode UE2.

Thus, the sealing layer SE1 is exposed in subpixel SP1.

Subsequently, in step ST34, as shown in FIG. 18, the second resist 42 is removed. By this process, the sealing layer SE2 of subpixel SP2 is exposed. Through these steps ST31 to ST34, the display element 202 is formed in subpixel SP2. The display element 202 includes the lower electrode LE2, the organic layer OR2 including the light emitting layer EM2, and the upper electrode UE2. The display element 202 is covered with the sealing layer SE2.

At this time, thickness T10 of the sealing layer SE1 is different from thickness T20 of the sealing layer SE2. For example, thickness T20 is greater than thickness T10 ($T10<T20$).

Steps ST41 to ST44 shown in FIG. 8 are similar to steps ST21 to ST24 described above, explanation thereof being omitted. Through these steps ST41 to ST44, the display element 203 is formed in subpixel SP3 shown in FIG. 3. The display element 203 includes the lower electrode LE3, the organic layer OR3 including the light emitting layer EM3, and the upper electrode UE3. The display element 203 is covered with the sealing layer SE3.

Subsequently, in step ST51, as shown in FIG. 19, dry etching is applied to the sealing layers SE1 and SE2. By this process, the sealing layer SE1 having thickness T1 is formed, and the sealing layer SE2 having thickness T2 is formed. At this time, the difference between thickness T10 and thickness T1 is equal to the difference between thickness T20 and thickness T2. By this dry etching, the sealing layer SE3 having thickness T3 is also formed at the same time.

Thickness T1 is the optimum thickness as the high-refractive layer of an optical adjustment layer for blue wavelengths.

Thickness T2 is the optimum thickness as the high-refractive layer of an optical adjustment layer for green wavelengths.

Thickness T3 is the optimum thickness as the high-refractive layer of an optical adjustment layer for red wavelengths.

Subsequently, in step ST52, as shown in FIG. 20, the transparent layer TL is formed on the sealing layers SE1 and SE2. Immediately above the partition 6, the transparent layer TL is formed on the sealing layers SE1 and SE2 and is in contact with the upper portion 62 of the partition 6. The transparent layer TL is formed of, for example, lithium fluoride. The transparent layer TL is formed by, for example, a vapor deposition method without providing a mask.

Subsequently, in step ST53, as shown in FIG. 21, the common sealing layer SE11 which is located above the sealing layers SE1 and SE2 and covers the transparent layer TL is formed. The common sealing layer SE11 is formed of, for example, silicon nitride. The common sealing layer SE11 is formed by, for example, a CVD method without providing a mask.

Subsequently, although not shown in the figure, a patterned resist is formed on the common sealing layer SE11. This resist covers the common sealing layer SE11 over the entire display area DA. The common sealing layer SE11 of the surrounding area SA is exposed from the resist. Subsequently, the common sealing layer SE11 exposed from the resist is removed by performing etching using the resist as a mask. Subsequently, the transparent layer TL is further removed. By this process, the terminal provided in the surrounding area SA is exposed. Subsequently, the resist is removed.

Subsequently, in step ST54, as shown in FIG. 22, the common sealing layer SE12 is formed on the common sealing layer SE11. The common sealing layer SE12 is formed by, for example, applying a transparent resin by ink-jet method. By this process, the common sealing layer SE12 is formed over the entire display area DA, and the terminal of the surrounding area SA is exposed from the common sealing layer SE12.

Subsequently, in step ST55, as shown in FIG. 23, the common sealing layer SE13 is formed on the common sealing layer SE12. The common sealing layer SE13 is formed of, for example, silicon nitride. The common sealing layer SE13 is formed by, for example, a CVD method without providing a mask. Thus, the common sealing layer SE13 covers the terminal of the surrounding area SA.

Subsequently, in step ST56, as shown in FIG. 24, the common sealing layer SE14 is formed on the common sealing layer SE13. The common sealing layer SE14 is formed by, for example, applying a transparent resin by ink-jet method. By this process, the common sealing layer SE14 is formed over the entire display area DA and does not overlap the terminal of the surrounding area SA.

Subsequently, although not shown in the figure, etching is performed using the common sealing layer SE14 as a mask to remove the common sealing layer SE13 exposed from the common sealing layer SE14 in the surrounding area SA. By this process, the terminal of the surrounding area SA is exposed.

Through the above steps, the display device DSP shown in FIG. 3 is manufactured.

Now, the manufacturing method of the display device DSP shown in FIG. 5 is explained with reference to FIG. 25 to FIG. 28. It should be noted that the process to step ST51 for performing dry etching for the sealing layers SE1 and SE2 is similar to the process described above, explanation thereof being omitted.

The section shown in each of FIG. 25 to FIG. 28 corresponds to, for example, the section taken along the A-B line of FIG. 2 and including subpixels SP1 and SP2. In each of FIG. 25 to FIG. 28, the illustrations of the substrate 10 and the circuit layer 11 lower than the insulating layer 12 are omitted.

First, in step ST53, as shown in FIG. 25, the common sealing layer SE11 is formed on the common sealing layers SE1 and SE2. Immediately above the partition 6, the common sealing layer SE11 is formed on the sealing layers SE1 and SE2 and is in contact with the upper portion 62 of the partition 6. The common sealing layer SE11 is formed of, for example, silicon oxide or silicon oxynitride. The common sealing layer SE11 is formed by, for example, a CVD method without providing a mask.

Subsequently, in step ST54, as shown in FIG. 26, the common sealing layer SE12 is formed on the common sealing layer SE11. The common sealing layer SE12 is formed by, for example, applying a transparent resin by ink-jet method. By this process, the common sealing layer SE12 is formed over the entire display area DA and does not overlap the terminal of the surrounding area SA.

Subsequently, in step ST55, as shown in FIG. 27, the common sealing layer SE13 is formed on the common sealing layer SE12. The common sealing layer SE13 is formed of, for example, silicon nitride. The common sealing layer SE13 is formed by, for example, a CVD method without providing a mask.

Subsequently, in step ST56, as shown in FIG. 28, the common sealing layer SE14 is formed on the common sealing layer SE13. The common sealing layer SE14 is formed by, for example, applying a transparent resin by ink-jet method. By this process, the common sealing layer SE14 is formed over the entire display area DA and does not overlap the terminal of the surrounding area SA.

Subsequently, although not shown in the figure, etching is performed using the common sealing layer SE14 as a mask to remove the common sealing layer SE13 exposed from the common sealing layer SE14 in the surrounding area SA. Subsequently, the common sealing layer SE11 is further removed. By this process, the terminal of the surrounding area SA is exposed.

Through the above steps, the display device DSP shown in FIG. 5 is manufactured.

In the above embodiment, the lower electrode LE1 corresponds to a first lower electrode. The lower electrode LE2 corresponds to a second lower electrode. The aperture AP1 corresponds to a first aperture. The aperture AP2 corresponds to a second aperture. The organic layer OR1 corresponds to a first organic layer. The organic layer OR2 corresponds to a second organic layer. The upper electrode UE1 corresponds to a first upper electrode. The upper electrode UE2 corresponds to a second upper electrode. The sealing layer SE1 corresponds to a first sealing layer. The sealing layer SE2 corresponds to a second sealing layer.

As explained above, the present embodiment can provide a display device which has an improved luminous efficiency and can prevent the degradation by moisture, and a manufacturing method thereof.

All of the display devices and manufacturing methods thereof that can be implemented by a person of ordinary skill in the art through arbitrary design changes to the display device and manufacturing method thereof described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiments and are self-explanatory from the descriptions of the specification or can be arbitrarily conceived by a person of ordinary skill in the art are considered as the effects of the present invention as a matter of course.

What is claimed is:

1. A display device comprising:
a substrate;
a lower electrode provided above the substrate;
a rib formed of an inorganic insulating material and comprising an aperture which overlaps the lower electrode;
a partition comprising a lower portion which is provided on the rib and is formed of a conductive material, and an upper portion which is provided on the lower portion and protrudes from a side surface of the lower portion;
an organic layer provided on the lower electrode in the aperture;
an upper electrode which covers the organic layer and is in contact with the lower portion of the partition;
a sealing layer which covers the upper electrode and is in contact with the lower portion of the partition; and
a common sealing layer formed of an inorganic insulating material and provided over a broader range than the sealing layer above the sealing layer, wherein
the sealing layer is formed of silicon nitride or a transparent oxide,
the common sealing layer covers the sealing layer and is in contact with the upper portion on the partition, and
a refractive index of the common sealing layer is less than a refractive index of the sealing layer.

2. The display device of claim 1, further comprising a transparent layer which is formed of an inorganic fluoride, is provided on the sealing layer, is covered with the common sealing layer and is in contact with the upper portion on the partition, wherein
a refractive index of the transparent layer is less than a refractive index of the sealing layer.

3. The display device of claim 2, wherein
a difference between the refractive index of the transparent layer and the refractive index of the sealing layer is greater than or equal to 0.2.

4. The display device of claim 2, wherein
the common sealing layer is formed of silicon nitride or silicon oxynitride.

5. The display device of claim 4, wherein
a refractive index of the common sealing layer is greater than the refractive index of the transparent layer.

6. The display device of claim 1, wherein
a difference between the refractive index of the common sealing layer and the refractive index of the sealing layer is greater than or equal to 0.2.

7. The display device of claim 1, wherein
the common sealing layer is formed of silicon oxide or silicon oxynitride.

8. The display device of claim 1, wherein
a thickness of the sealing layer is less than a thickness of the lower portion of the partition.

9. The display device of claim 1, wherein
a thickness of the sealing layer is less than a thickness of the common sealing layer.

10. A manufacturing method of a display device, comprising:
forming a first lower electrode and a second lower electrode above a substrate;

forming a rib comprising a first aperture which overlaps the first lower electrode and a second aperture which overlaps the second lower electrode;

forming a partition comprising a lower portion located on the rib between the first aperture and the second aperture, and an upper portion which is located on the lower portion and protrudes from a side surface of the lower portion;

forming a first organic layer on the first lower electrode and the second lower electrode;

forming a first upper electrode on the first organic layer;

forming a first sealing layer which covers the first upper electrode and is in contact with the lower portion of the partition;

forming a first resist on the first sealing layer immediately above the first lower electrode;

removing the first sealing layer, the first upper electrode and the first organic layer using the first resist as a mask immediately above the second lower electrode;

forming a second organic layer on the first sealing layer and the second lower electrode;

forming a second upper electrode on the second organic layer;

forming a second sealing layer which covers the second upper electrode and is in contact with the lower portion of the partition;

forming a second resist on the second sealing layer immediately above the second lower electrode;

removing the second sealing layer, the second upper electrode and the second organic layer using the second resist as a mask immediately above the first sealing layer; and forming a common sealing layer above the first sealing layer and the second sealing layer, wherein each of the first sealing layer and the second sealing layer is formed of silicon nitride or a transparent oxide, and the common sealing layer is formed of an inorganic insulating material.

11. The manufacturing method of claim 10, wherein the first sealing layer and the second sealing layer are formed so as to have different thicknesses.

12. The manufacturing method of claim 10, further comprising, forming a transparent layer which is located on the first sealing layer and the second sealing layer and is in contact with the upper portion on the partition is formed, before forming the common sealing layer, wherein the transparent layer is formed of an inorganic fluoride, and a refractive index of the transparent layer is less than refractive indices of the first sealing layer and the second sealing layer.

13. The manufacturing method of claim 12, wherein the common sealing layer is formed of silicon nitride or silicon oxynitride.

14. The manufacturing method of claim 12, further comprising, performing etching for the first sealing layer and the second sealing layer to reduce thicknesses of the first sealing layer and the second sealing layer, before forming the transparent layer.

15. The manufacturing method of claim 10, wherein the common sealing layer is formed so as to cover the first sealing layer and the second sealing layer and to be in contact with the upper portion on the partition, and a refractive index of the common sealing layer is less than refractive indices of the first sealing layer and the second sealing layer.

16. The manufacturing method of claim 15, wherein the common sealing layer is formed of silicon oxide or silicon oxynitride.

17. The manufacturing method of claim 15, further comprising, performing etching for the first sealing layer and the second sealing layer to reduce thicknesses of the first sealing layer and the second sealing layer, before forming the common sealing layer.

18. The manufacturing method of claim 10, wherein a thickness of each of the first sealing layer and the second sealing layer is less than a thickness of the lower portion of the partition.

19. The manufacturing method of claim 10, wherein a thickness of each of the first sealing layer and the second sealing layer is less than a thickness of the common sealing layer.

20. A display device comprising:

a substrate;

a lower electrode provided above the substrate;

a rib formed of an inorganic insulating material and comprising an aperture which overlaps the lower electrode;

a partition comprising a lower portion which is provided on the rib and is formed of a conductive material, and an upper portion which is provided on the lower portion and protrudes from a side surface of the lower portion;

an organic layer provided on the lower electrode in the aperture;

an upper electrode which covers the organic layer and is in contact with the lower portion of the partition;

a sealing layer which is formed of an inorganic insulating material, covers the upper electrode and is in contact with the lower portion of the partition; and a common sealing layer formed of an inorganic insulating material and provided over a broader range than the sealing layer above the sealing layer, wherein the common sealing layer covers the sealing layer and is in contact with the upper portion on the partition, and a refractive index of the common sealing layer is less than a refractive index of the sealing layer.

* * * * *